United States Patent
Lee et al.

(10) Patent No.: US 9,685,227 B2
(45) Date of Patent: Jun. 20, 2017

(54) CONTROL OF MEMORY DEVICE READING BASED ON CELL RESISTANCE

(71) Applicant: SAMSUNG ELECTRONICS CO., LTD., Suwon-si, Gyeonggi-Do (KR)

(72) Inventors: Yong-Kyu Lee, Hwaseong-si (KR); Yeong-Taek Lee, Seoul (KR); Dae-Seok Byeon, Seongnam-si (KR); Hyun-Kook Park, Anyang-si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/661,935

(22) Filed: Mar. 18, 2015

(65) Prior Publication Data

US 2015/0364188 A1 Dec. 17, 2015

(30) Foreign Application Priority Data

Jun. 16, 2014 (KR) .......................... 10-2014-0072970

(51) Int. Cl.
| | |
|---|---|
| *G11C 13/00* | (2006.01) |
| *G11C 11/56* | (2006.01) |
| *G11C 7/06* | (2006.01) |
| *G11C 11/16* | (2006.01) |

(52) U.S. Cl.
CPC .............. *G11C 13/004* (2013.01); *G11C 7/06* (2013.01); *G11C 11/1673* (2013.01); *G11C 11/56* (2013.01); *G11C 11/5607* (2013.01); *G11C 11/5614* (2013.01); *G11C 11/5678* (2013.01); *G11C 11/5685* (2013.01); *G11C 13/0002* (2013.01); *G11C 2013/0054* (2013.01); *G11C 2213/71* (2013.01)

(58) Field of Classification Search
CPC . G11C 11/56; G11C 11/5607; G11C 11/5614; G11C 11/5678; G11C 13/0002; G11C 2013/004; G11C 2013/0045; G11C 2213/10; G11C 2213/15
See application file for complete search history.

(56) References Cited

U.S. PATENT DOCUMENTS

| | | | |
|---|---|---|---|
| 6,259,644 B1* | 7/2001 | Tran ...................... | B82Y 10/00 257/E21.665 |
| 7,180,767 B2* | 2/2007 | Chen ...................... | G11C 11/56 365/148 |
| 7,881,100 B2* | 2/2011 | Ma ....................... | G11C 11/5678 365/148 |
| 8,169,823 B2* | 5/2012 | Bae ....................... | G11C 11/005 365/185.05 |
| 8,223,537 B2 | 7/2012 | Ma et al. | |
| 8,451,648 B2 | 5/2013 | Kamoshida et al. | |

(Continued)

*Primary Examiner* — Vanthu Nguyen
(74) *Attorney, Agent, or Firm* — Volentine & Whitt, PLLC

(57) ABSTRACT

A method of reading a memory device that includes a memory cell that stores data of at least two bits includes determining whether a cell resistance level is no greater than a threshold resistance level. If the cell resistance level is smaller than or equal to the threshold resistance level, then the data is read based on a first factor that is inversely proportional to the cell resistance level. If the cell resistance level is greater than the threshold resistance level, then the data is read based on a second factor that is proportional to the cell resistance level.

16 Claims, 21 Drawing Sheets

(56) References Cited

U.S. PATENT DOCUMENTS

| | | | |
|---|---|---|---|
| 8,675,415 B2* | 3/2014 | Kim | G11C 11/5628 |
| | | | 365/185.21 |
| 2010/0085794 A1 | 4/2010 | Chen et al. | |
| 2010/0188885 A1 | 7/2010 | Toda et al. | |
| 2010/0208508 A1 | 8/2010 | Baek et al. | |
| 2011/0128790 A1 | 6/2011 | Sarin et al. | |
| 2012/0026777 A1 | 2/2012 | Kitagawa et al. | |
| 2012/0314478 A1 | 12/2012 | Ha et al. | |
| 2013/0010528 A1 | 1/2013 | Ramani et al. | |
| 2013/0021844 A1 | 1/2013 | Pyeon | |
| 2013/0094275 A1 | 4/2013 | Chen | |
| 2013/0155755 A1 | 6/2013 | Park et al. | |
| 2013/0170283 A1 | 7/2013 | Lan et al. | |
| 2013/0250651 A1 | 9/2013 | Sills | |
| 2014/0133214 A1* | 5/2014 | Yim | G11C 13/004 |
| | | | 365/148 |

\* cited by examiner

CONTROL OF MEMORY DEVICE READING BASED ON CELL RESISTANCE

CROSS-REFERENCE TO RELATED APPLICATIONS

This application claims the benefit of Korean Patent Application No. 10-2014-0072970, filed on Jun. 16, 2014, in the Korean Intellectual Property Office, the disclosure of which is incorporated herein in its entirety by reference.

BACKGROUND

The inventive concept relates to memory devices, and more particularly, to a memory device and a method of reading the memory device.

Next generation memory devices having nonvolatile characteristics without the aid of refresh operations are continuously being developed in response to the need for high integration density memory devices having low power consumption. Next generation memory devices need to be designed to have the high integration density of dynamic random access memory (DRAM) devices, nonvolatile characteristics of flash memory devices, and the high speed of static random access memory (SRAM) devices. Phase change random access memory (PRAM or PcRAM) devices, nano floating gate memory (NFGM) devices, polymer random access memory (PoRAM) devices, magnetic random access memory (MRAM) devices, ferroelectric random access memory (FRAM or FeRAM) devices and resistive random access memory (RRAM or ReRAM) devices are attracting much attention as next generation memory devices that meet the above requirements.

SUMMARY

Better methods of reading memory devices are always desired. Accordingly, in one aspect of the inventive concept described herein, a method of reading a memory device including a memory cell that stores data of at least two bits comprises determining whether a resistance level of the memory cell (cell resistance level) is no greater than a threshold resistance level. If the cell resistance level is smaller than or equal to the threshold resistance level, then reading the data based on a first factor that is inversely proportional to the cell resistance level. If the cell resistance level is greater than the threshold resistance level, then reading the data based on a second factor that is proportional to the cell resistance level.

In another aspect of the inventive concept, a memory device comprises a memory cell array including a memory cell that stores data of at least two bits and has a cell resistance level corresponding to the data, and a read circuit configured to read the data based on a first factor that is inversely proportional to the cell resistance level when the cell resistance level is smaller than or equal to a threshold resistance level, and to read the data based on a second factor that is proportional to the cell resistance level when the cell resistance level is greater than the threshold resistance level.

In yet another aspect of the inventive concept, a memory control system comprises a memory controller and a memory device. The memory device includes a memory cell array including a memory cell that stores data of at least two bits and has a cell resistance level corresponding to the data. The memory device also includes a read circuit configured to read the data based on a first factor that is inversely proportional to the cell resistance level when the cell resistance level is smaller than or equal to a threshold resistance level, and to read the data based on a second factor that is proportional to the cell resistance level when the cell resistance level is greater than the threshold resistance level. The memory controller is configured to control the memory device such that data stored in the memory device is read out and/or external data is stored in the memory device in response to a read and/or write request from a host.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
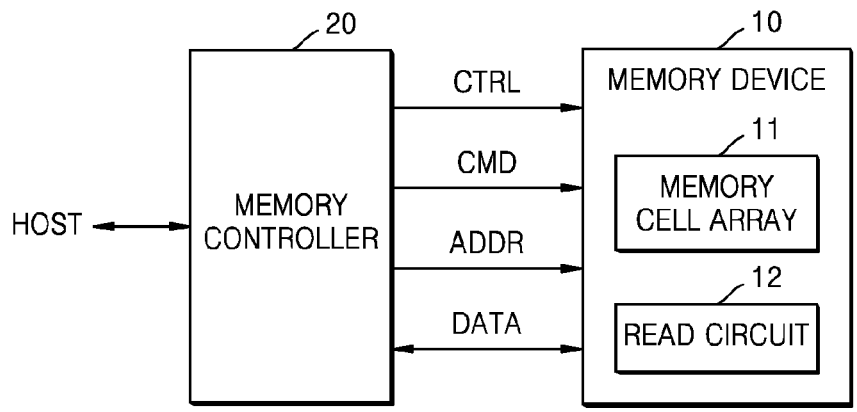
FIG. 1 is a schematic block diagram of a memory system based on an embodiment of the inventive concept.

Hereinafter, the inventive concept will be described more fully with reference to the accompanying drawings, in which exemplary embodiments are shown. These embodiments are provided so that this disclosure will be thorough and complete, and will fully convey the scope of the inventive concept to one of ordinary skill in the art. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the drawings, like reference numerals denote like elements and the sizes or thicknesses of elements may be exaggerated for clarity of explanation.

The terms used in the present specification are merely used to describe particular embodiments, and are not intended to limit the inventive concept. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components are not be limited to the above terms. The above terms are used only to distinguish one component from another. For example, a first component discussed below could be termed a second component, and similarly, a second component may be termed a first component without departing from the teachings of this disclosure.

Unless defined differently, all terms used in the description including technical and scientific terms have the same meaning as generally understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of one or more of the associated listed items. Expressions such as "at least one of," when preceding a list of elements, modify the entire list of elements and do not modify the individual elements of the list.

Referring to FIG. 1, a memory system 1 in an exemplary embodiment may include a memory device 10 and a memory controller 20. The memory device 10 may include a memory cell array 11 and a read circuit 12.

The memory controller 20 may control the memory device 10 such that data stored in the memory device 10 is read out or external data is stored in the memory device 10 in response to a read/write request from a host. In detail, the memory controller 20 may provide the memory device 10 with an address signal ADDR, a command signal CMD and a control signal CTRL to control a program (or write) operation, a read operation and an erasure operation of the memory device 10. Data DATA for programming the memory device 10 may be transmitted from the memory controller 20 to the memory device 10 during the program operation, and data DATA read out from the memory device 10 may be transmitted to the memory controller 20.

Although not shown in the drawings, the memory controller 20 may be configured to include a RAM device, a processing unit, a host interface, and a memory interface. The RAM device may be used as an operation memory of the processing unit. The processing unit may control the operation of the memory controller 20. The host interface may include a protocol for data exchange between the host and the memory controller 20. For example, the memory controller 20 may be configured to communicate with an external system (e.g., the host) through at least one of various interface protocols, such as a universal serial bus (USB), a multi-media card (MMC), a peripheral component interconnect express (PCI-E), an advanced technology attachment (ATA), a serial-ATA, a parallel-ATA, a small computer system interface (SCSI), an enhanced small device interface (ESDI), and/or an integrated drive (or device) electronics (IDE).

The memory cell array 11 may include a plurality of memory cells (not shown) respectively disposed at intersections of a plurality of first signal lines and a plurality of second signal lines. In some embodiments, the plurality of first signal lines may be a plurality of bit lines and the plurality of second signal lines may be a plurality of word lines. Alternatively, the plurality of first signal lines may be a plurality of word lines and the plurality of second signal lines may be a plurality of bit lines.

In an exemplary embodiment, each of the memory cells may be a multi-level cell that may store at least two bits of data. Accordingly, each of the memory cells may have one of at least 4 resistance levels. In some embodiments, each of the memory cells may be a multi-level cell (MLC) that stores two bits of data, in which case each of the memory cells may have one of 4 resistance levels. In other possible embodiments, each of the memory cells may be a triple level cell (TLC) that stores three bits of data, in which case each of the memory cells may have one of 8 resistance levels. However, possible embodiments are not limited to these embodiments. In other embodiments for example, each of the memory cells may store at least four bits of data.

In some embodiments, the plurality of memory cells may have a two-dimensional (2D) horizontal structure. Alternatively, the plurality of memory cells may have a three-dimensional (3D) vertical structure.

The plurality of memory cells may include resistive memory cells each having a variable resistor (not shown) having a variable resistance. For example, when the variable resistor is formed of a phase change material (e.g., Ge—

Sb—Te (GST)) and resistance thereof changes based on a temperature, the memory device 10 may be a phase change RAM (PRAM). In another example, when the variable resistor includes an upper electrode, a lower electrode, and transition metal oxide between the upper and lower electrodes, the memory device 10 may be a resistive RAM (RRAM). In another example, when the variable resistor includes an upper electrode of a magnetic material, a lower electrode of the magnetic material, and a dielectric material between the upper and lower electrodes, the memory device 10 may be a magnetic RAM (MRAM).

The read circuit 12 may determine whether the resistance level of each memory cell is less than or equal to a threshold resistance level. When each memory cell is in a low resistance state (LRS) in which the resistance level is less than or equal to the threshold resistance level, the read circuit 12 may read data from the memory cell based on a first factor that is inversely proportional to the resistance level. On the other hand, when each memory cell is in a high resistance state HRS where a resistance level is greater than the threshold resistance level, the read circuit 12 may read data from the memory cell based on a second factor that is proportional to the resistance level.

Since the first factor is inversely proportional to the resistance level, a sensing margin in the low resistance state LRS is greater than that in the high resistance state HRS with respect to an identical resistance difference. Thus, a read operation with respect to a memory cell in the low resistance state LRS is performed based on the first factor, whereby the accuracy of the read operation may be improved. Since the second factor is proportional to the resistance level, a sensing margin in the low resistance state LRS is equal to that in the high resistance state HRS with respect to an identical resistance difference. Thus, a read operation with respect to a memory cell in the high resistance state HRS is performed based on the second factor, whereby the accuracy of the read operation may be improved.

In this exemplary embodiment, the first factor may correspond to a cell current flowing in the memory cell, and the second factor may correspond to a sensing voltage at a sensing time point of a sensing node connected to the memory cell. However, other embodiments are not limited thereto. The first factor may be any factor as long as it is inversely proportional to the resistance level, and the second factor may be any factor as long as it is proportional to the resistance level. In some embodiments, the second factor may be the time period while the sensing voltage is reduced. In other embodiments, the second factor may be the resistance level itself.

The memory controller 20 and the memory device 10 may be integrated into a single semiconductor device to constitute a memory card for example. In some embodiments, the memory controller 20 and the memory device 10 may be integrated into a single semiconductor device to constitute a personal computer memory card international association (PCMCIA) card, a compact flash (CF) card, a smart media card (SMC), a memory stick, a multi-media card (MMC) such as a reduced size multi-media card (RS-MMC) or a MMCmicro, a secure digital (SD) card such as a mini-CD card or a micro-CD card, or a universal flash storage (UFS). Alternatively, the memory controller 20 and the memory device 10 may be integrated into a single semiconductor device to constitute a solid state drive (SSD) system.

Figure 2:
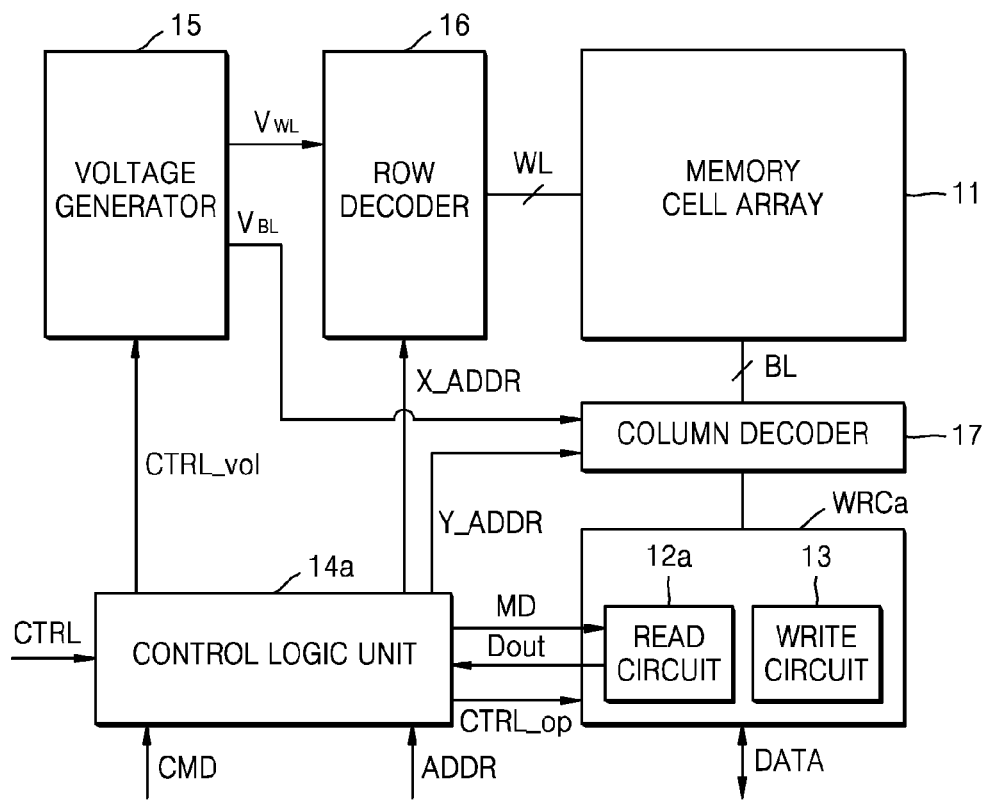
FIG. 2 is a block diagram of an example of a memory device included in the memory system of FIG. 1.

Referring to FIG. 2, the memory device 10a may include the memory cell array 11 of FIG. 1, a read circuit 12a, a write circuit 13, a control logic unit 14a, a voltage generator 15, a row decoder 16, and a column decoder 17. The read circuit 12a and the write circuit 13 may be combined with each other to constitute a write/read circuit WRCa. The components included in the memory device 10a will now be described in detail.

The memory cell array 11 may be connected to the plurality of first signal lines and the plurality of second signal lines. The memory cell array 11 may include a plurality of memory cells respectively disposed at intersections of the plurality of first signal lines and the plurality of second signal lines. Hereinafter, embodiments will be described in conjunction with an example in which the first signal lines are bit lines BL and the second signal lines are word lines WL.

The read circuit 12a may be electrically connected to one of the bit lines BL to read data from a selected memory cell. As such, the read circuit 12a may output the data DATA read from the memory cell array 11. In an exemplary embodiment, the read circuit 12a may determine whether a resistance level of a selected memory cell is less than or equal to a threshold resistance level, and may provide a determination result Dout to the control logic unit 14a. The read circuit 12a may receive a mode decision signal MD from the control logic unit 14a and perform a read operation in a first or second read mode based on the received mode decision signal MD.

In the first read mode, when the resistance level of the memory cell is less than or equal to the threshold resistance level, the read operation is performed based on a first factor inversely proportional to the resistance level. In an exemplary embodiment the first factor may be cell current flowing in the memory cell, and the first read mode may be referred to as current sensing mode.

In the second read mode, when the resistance level of the memory cell is greater than the threshold resistance level, a read operation is performed based on a second factor proportional to the resistance level. In an exemplary embodiment the second factor may be sensing voltage at a sensing time point of a sensing node connected to the memory cell, and the second read mode may be referred to as a voltage sensing mode.

The write circuit 13 may be electrically connected to the bit line BL to supply a write current to the selected memory cell. As such, the write circuit 13 may write desired data into the memory cell array 11. The write circuit 13 may supply a write current (or a program current) to the selected bit line BL during a write operation (or a program operation). In detail, the write circuit 13 may generate a set write current in response to a set pulse and may generate a reset write current in response to a set pulse. In an exemplary embodiment the set pulse may be a first set pulse, a second set pulse, or a third set pulse, and the set write pulse may be a first set write pulse, a second set write pulse, or a third set write pulse.

The control logic unit 14a may receive the command signal CMD, the address signal ADDR, and the control signal CTRL from the memory controller 20 to output various control signals for writing the data DATA to the memory cell array 11 or for reading the data DATA out of the memory cell array 11. In this way, the control logic unit 14a may control overall operations of the memory device 10a.

The control signals outputted from the control logic unit 14a may be applied to the write/read circuit WRCa, the voltage generator 15, the row decoder 16, and the column decoder 17. In detail, the control logic unit 14a may apply an operation control signal CTRL_op to the write/read circuit WRCa, may apply the mode decision signal MD to the read circuit 12a, and may apply a voltage control signal CTRL_vol to the voltage generator 15. The control logic unit 14 may also apply a row address signal X_ADDR to the row decoder 16 and may apply a column address signal Y_ADDR to the column decoder 17.

The voltage generator 15 may receive the voltage control signal CTRL_vol to generate various voltage signals for executing a program operation, a read operation, and an erasure operation of the memory cell array 11. In detail, the voltage generator 15 may generate a first drive voltage signal $V_{WL}$ for driving the word lines WL and a second drive voltage signal $V_{BL}$ for driving the bit lines BL.

The first drive voltage signal $V_{WL}$ may be a reset write voltage signal Vreset, a pass voltage signal Vpass, an inhibition voltage signal Vinh, or a program verification voltage signal Vver. The second drive voltage signal $V_{BL}$ may be a set write voltage signal Vset, a pass voltage signal Vpass, or an inhibition voltage signal Vinh. The set write voltage signal Vset may have one of a plurality of voltage levels corresponding to data which is to be written.

The row decoder 16 may be connected to the memory cell array 11 through the plurality of word lines WL and may activate one selected from the plurality of word lines WL in response to the row address signal X_ADDR received from the control logic unit 14a. In detail, the row decoder 16 may control a voltage applied to the selected word line WL from among the plurality of word lines WL and control a connection relationship of the selected word line WL in response to the row address signal X_ADDR.

The column decoder 17 may be connected to the memory cell array 11 through the plurality of bit lines BL and may activate one of bit lines BL in response to the column address signal Y_ADDR received from the control logic unit 14a. In detail, the column decoder 17 may control a voltage applied to the selected bit line BL, and control a connection relationship of the selected bit line WL in response to the column address signal Y_ADDR.

Figure 3:
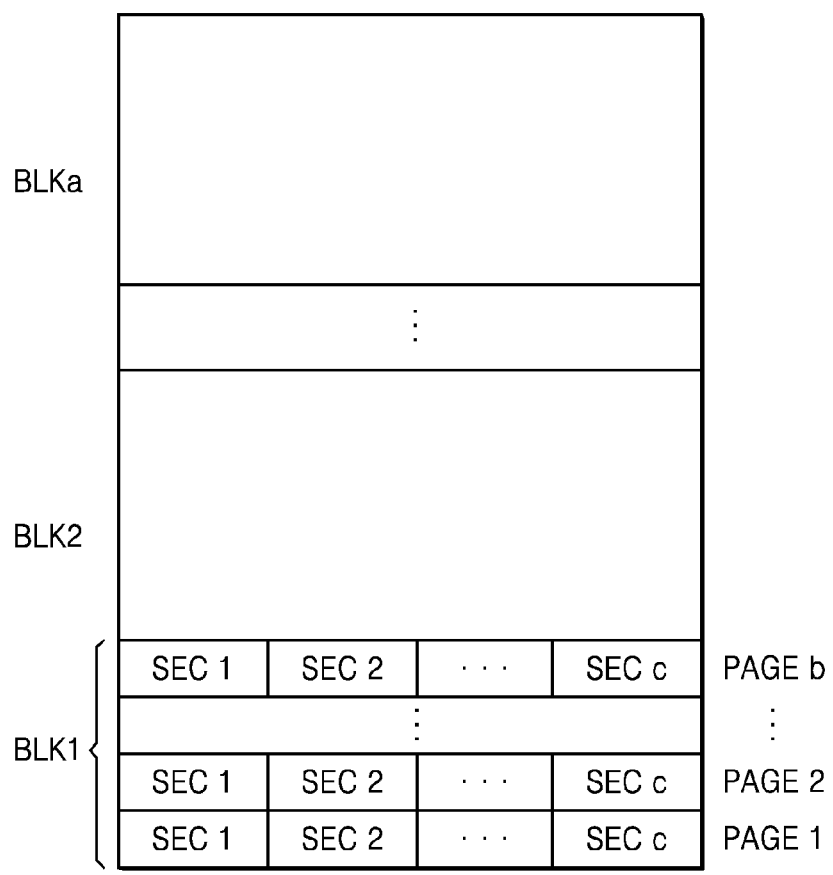
FIG. 3 is a block diagram of a memory cell array included in the memory device of FIG. 2.

Referring to FIG. 3, the memory cell array 11 may be a resistive memory cell array. In this case, the memory cell array 11 may include a plurality of memory blocks BLK1, BLK2, . . . , and BLKa (where "a" denotes a positive integer equal to or greater than two) and each of the memory blocks BLK1, . . . , and BLKa may include a plurality of pages PAGE1, PAGE2, . . . , and PAGEb (where "b" denotes a positive integer equal to or greater than two). In addition, each of the pages PAGE1, . . . , and PAGEb may include a plurality of sectors SEC1, SEC2, . . . , and SECc (where "c" denotes a positive integer equal to or greater than two). Although the pages PAGE1 through PAGEb and the sectors SEC1 through SECc of only the memory block BLK1 are illustrated for convenience of explanation in FIG. 3, the other memory blocks BLK2 through BLKa may have the same structures as that of the memory block BLK1.

Figure 4:
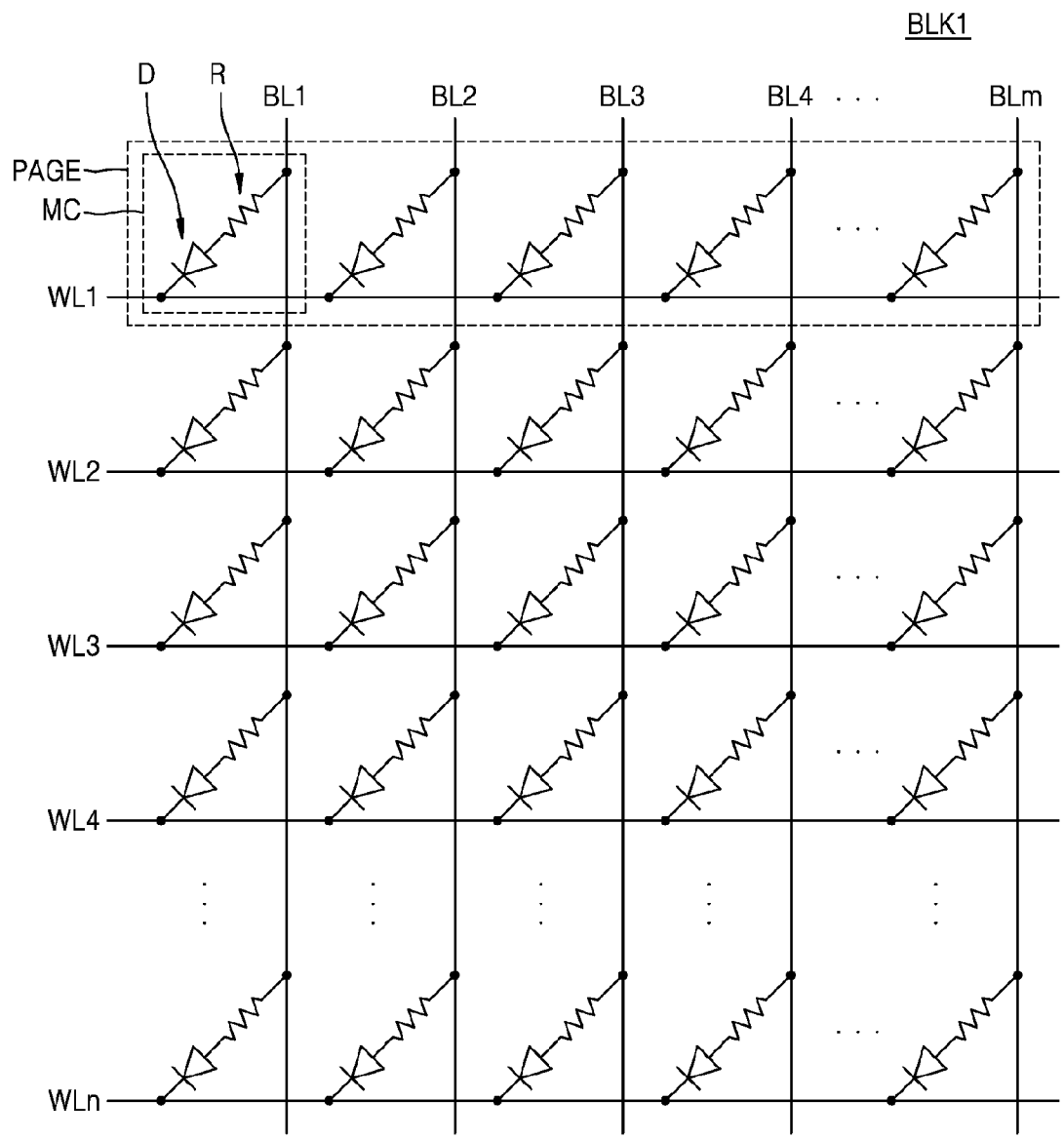
FIG. 4 is an equivalent circuit diagram of a first memory cell included in the memory cell array of FIG. 3.

FIG. 4 illustrates a first memory block BLK1, e.g. the memory block BLK1, included in the memory cell array 11 of FIG. 3, and may be a memory having a horizontal structure. Each of the second memory block BLK2 to the a-th memory block BLKa may have substantially the same configuration as illustrated in FIG. 4. The first memory block BLK1 may include a plurality of word lines WL1, . . . , and WLn, a plurality of bit lines BL1, . . . , and BLm, and a plurality of memory cells MC. The number of word lines WL1, . . . , and WLn, the number of bit lines BL1, . . . , and BLm. The number of memory cells MC may vary in various embodiments.

In an exemplary embodiment, each of the memory cells MC may include a variable resistor R and a selection element D. The variable resistor R may be referred to as a variable resistance material and the selection element D may be referred to as a switching element.

For example, each of the variable resistors R may be coupled between one of the bit lines BL1, . . . , and BLm and one of the selection elements D, and each of the selection elements D may be coupled between one of the word lines WL1, . . . , and WLn and one of the variable resistors R. However, the inventive concept is not limited to the above configuration. For example, each of the selection elements D may be coupled between one of the bit lines BL1, . . . , and BLm and one of the variable resistors R, and each of the variable resistors R may be coupled between one of the word lines WL1, . . . , and WLn and one of the selection elements D.

In an exemplary embodiment, the resistance state of each of the variable resistors R may be changed in response to an electric pulse signal applied thereto. In some embodiments, each of the variable resistors R may include a phase-change material whose crystalline state varies as the amount of current applied thereto changes. The phase-change material may be one of binary materials such as GaSb, InSb, InSe, $Sb_2Te_3$ and GeTe, one of ternary materials such as GeSbTe, GaSeTe, InSbTe, $SnSb_2Te_4$ and InSbGe, or one of quaternary materials such as AgInSbTe, (GeSn)SbTe, GeSb(SeTe) and $Te_{81}Ge_{15}Sb_2S_2$.

Each of the phase-change materials listed above may have an amorphous state exhibiting a relatively high resistance value or a crystalline state exhibiting a relatively low resistance value. A phase of the phase-change materials listed above may be changed by Joule's heat generated based on an amount of current. Thus, desired data may be written in the phase-change materials using the phase changeable characteristic of the phase-change materials.

In other embodiments, each of the variable resistors R may include one of a perovskite material, transition metal oxide, a magnetic material, a ferroelectric material, or an antiferromagnetic material, instead of the phase-change material.

Each of the selection elements D may be coupled between corresponding word lines and corresponding variable resistors R, and may control an amount of current flowing through the variable resistor R based on voltage difference between the connected word line and a corresponding bit line. In some embodiments, the selection elements D may be PN diodes or PIN diodes. In this case, anodes of the diodes D may be connected to the variable resistors R and cathodes of the diodes D may be connected to the corresponding word line. Accordingly, if a voltage applied between the anode and the cathode of a diode D is higher than a threshold voltage of the diode D, the diode D may be turned on to supply a current to the variable resistor R.

Figure 5:
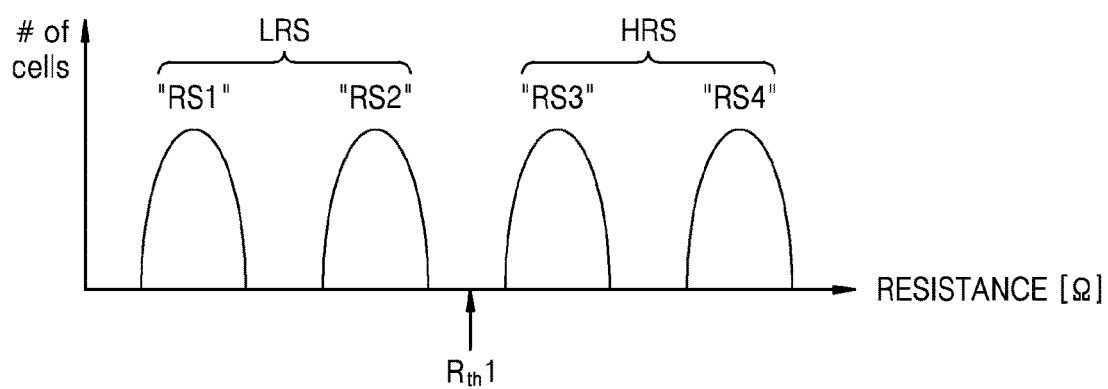
FIG. 5 is a graph showing a distribution of memory cells with respect to resistance when a memory cell of FIG. 4 is a multi-level cell (MLC)

Referring to FIG. 5, a graph showing distribution of memory cells MC with respect to resistance when the memory cell of FIG. 4 is a multi level cell, the horizontal axis represents a resistance of the memory cells MC and the vertical axis represents the number of memory cells MC. When the memory cells MC are MLCs programmed with two bits, each of the memory cells MC may exhibit a first resistance state RS1, a second resistance state RS2, a third resistance state RS3, or a fourth resistance state RS4.

In an exemplary embodiment, a threshold resistance level $R_{th}1$ may be a resistance level in-between the second resistance state RS2 and the third resistance state RS3. In this case, the first resistance state RS1 and the second resistance state RS2, which are lower than the threshold resistance level $R_{th}1$, may be referred to as low resistance states LRS, and the third resistance state RS3 and the fourth resistance state RS4, higher than the threshold resistance level $R_{th}1$, may be referred to as high resistance states HRS.

In the case of MLCs as compared to single level cells, an interval between resistance states is narrow. This small resistance change may lead to occurrence of read errors of the MLCs. Thus, a distribution range of each of the first to fourth resistance states RS1, RS2, RS3 and RS4 has to be determined so that the first to fourth resistance states RS1, RS2, RS3 and RS4 do not overlap with one another.

Each of the first to fourth resistance states RS1, RS2, RS3 and RS4 may correspond to data '00', data '01', data '10', or data '11'. In an exemplary embodiment, a resistance level R may increase in the order of data '11', data '01', data '00', and data '10'. In other words, the first to fourth resistance states RS1, RS2, RS3 and RS4 may correspond to data '11', data '01', data '00', and data '10', respectively.

Figure 6:
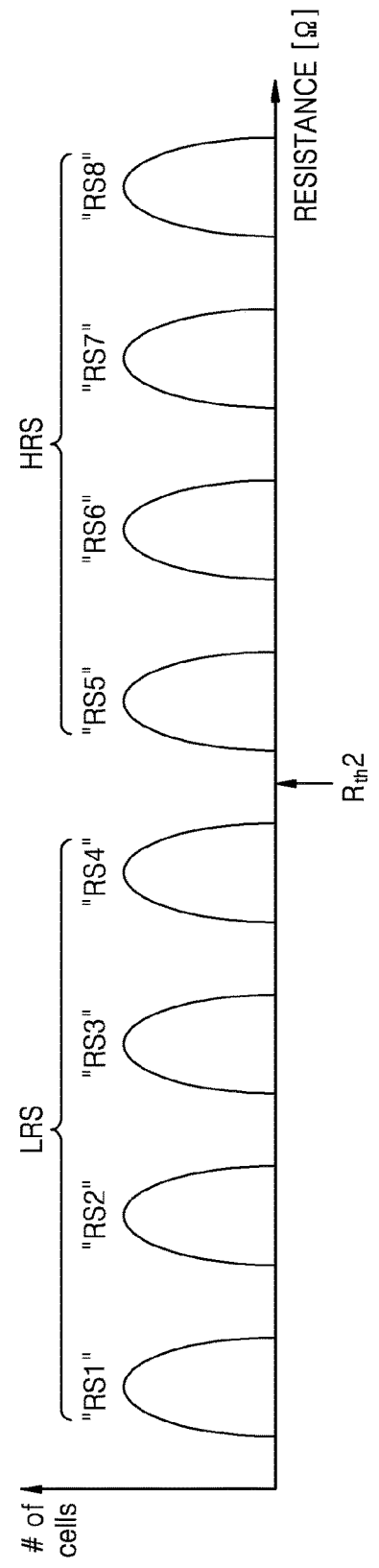
FIG. 6 is a graph showing a distribution of memory cells with respect to resistance when a memory cell of FIG. 4 is a triple level cell (TLC)

Referring to FIG. 6, a graph showing distribution of memory cells MC with respect to resistance when the memory cell of FIG. 4 is a triple-level cell, the horizontal axis represents a resistance of the memory cells MC and the vertical axis represents the number of memory cells MC. When the memory cells MC are triple-level cells (TLCs) programmed with three bits, each of the memory cells MC may exhibit a first resistance state RS1, a second resistance state RS2, a third resistive state RS3, a fourth resistance state RS4, a fifth resistance state RS5, a sixth resistance state RS6, a seventh resistance state RS7, or an eighth resistance state RS8.

In an exemplary embodiment, a threshold resistance level $R_{th}2$ may be a resistance level in between the fourth resistance state RS4 and the fifth resistance state RS5. In this case, the first to fourth resistance states RS1 to RS4, which are lower than the threshold resistance level $R_{th}2$ may be referred to as low resistance states LRS, and the fifth to eighth resistance states RS5 to RS8, which are higher than the threshold resistance level $R_{th}2$, may be referred to as high resistance states HRS.

In the case of TLCs as compared to MLCs programmed with two bits, an interval between resistance states is narrow. This small resistance change may lead to occurrence of read errors of the TLCs. Thus, distribution range of each of the first to eighth resistance states RS1, RS2, RS3, RS4, RS5, RS6, RS7, and RS8 has to be determined so that the first to eighth resistance states RS1, RS2, RS3, RS4, RS5, RS6, RS7, and RS8 do not overlap with one another.

Each of the first through eighth resistance states RS1, RS2, RS3, RS4, RS5, RS6, RS7, and RS8 may correspond to data '000', data '001', data '010', data '011', data '100', data '101', data '110', or data '111'. In an exemplary embodiment, a resistance level R may increase in the order of data '111', data '110', data '100', data '000', data '010', data '011', data '001', and data '101'. In other words, the first through eighth resistance states RS1, RS2, RS3, RS4, RS5, RS6, RS7, and RS8 may correspond to data '111', data '110', data '100', data '000', data '010', data '011', data '001', and data '101', respectively.

Figure 7:
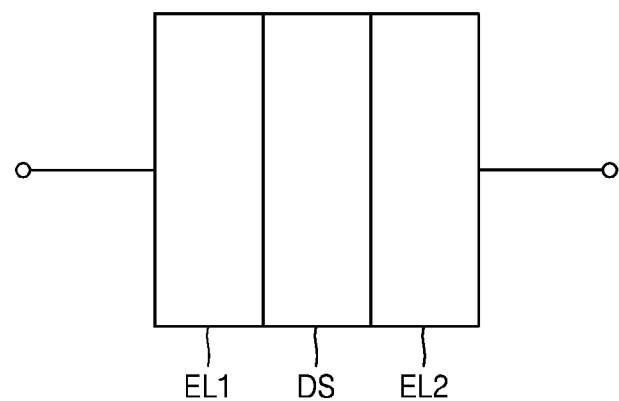
FIG. 7 illustrates a variable resistor included in the memory cell of FIG. 4.

Referring to FIG. 7, the variable resistor R included in each of the memory cells MC illustrated in FIG. 4, may include a first electrode EL1, a second electrode EL2, and a data storage film DS disposed between the first and second electrodes EL1 and EL2.

The first and second electrodes EL1 and EL2 may be formed of any of various materials including metal, metal oxide, or metal nitride. For example, the first and second electrodes EL1 and EL2 may be formed of aluminum (Al), copper (Cu), titanium nitride (TiN), titanium aluminum nitride ($Ti_xAl_yN$), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconium (Zr), zinc (Zn), iridium oxide ($IrO_2$) or strontium zirconium oxide ($SrZrO_3$).

The data storage film DS may be formed of a bipolar resistive storage material or a unipolar resistive storage material. The bipolar resistive storage material may be programmed to have a set state or a reset state based on polarity of a pulse applied thereto. Perovskite-based materials may be used as the bipolar resistive storage material. The unipolar resistive storage material may be programmed to have a set state or a reset state even by pulses having the same polarity. Transition metal oxide materials such as those comprising nickel oxide $(NiO)_x$ and/or titanium oxide $(TiO_x)$ may be used as the unipolar resistive storage material.

FIGS. 8A through 8D are equivalent circuit diagrams illustrating various modified embodiments of each of the memory cells MC shown in FIG. 4.

Figure 8A:
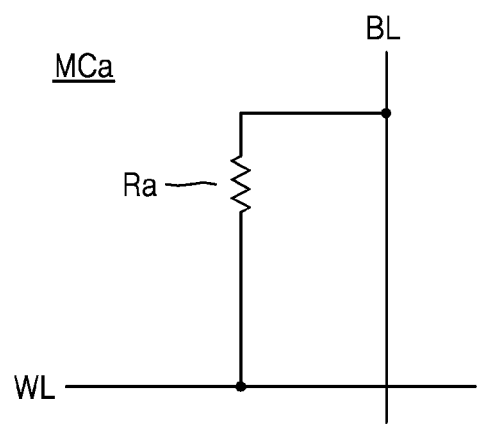
FIGS. 8A through 8D are equivalent circuit diagrams illustrating various modified embodiments of the memory cell of FIG. 4.

Referring to FIG. 8A, a memory cell MCa may include a variable resistor Ra, and the variable resistor Ra may be coupled between a bit line BL and a word line WL. The memory cell MCa may be programmed by voltage signals respectively applied to the bit line BL and the word line WL.

Figure 8B:
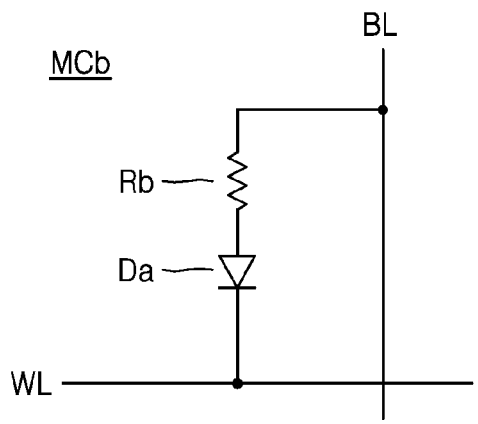

Referring to FIG. 8B, a memory cell MCb may include a variable resistor Rb and a diode Da which are connected in series. The variable resistor Rb may include a resistive material for storing data. The diode Da may be a selection element, that is, a switching element that supplies or blocks a current to the variable resistor Rb based on bias condition between the word line WL and the bit line BL. The diode Da may be coupled between the variable resistor Rb and the word line WL, and the variable resistor Rb may be coupled between the diode Da and the bit line BL. In some embodiments, the locations of the diode Da and the variable resistor Rb may be interchanged.

Figure 8C:
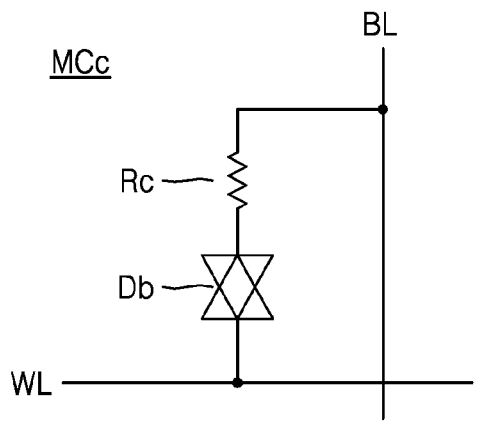

Referring to FIG. 8C, a memory cell MCc may include a variable resistor Rc and a bidirectional diode Db which are connected in series. The variable resistor Rc may include a resistive material for storing data. The bidirectional diode Db may be coupled between the variable resistor Rc and the word line WL, and the variable resistor Rc may be coupled between the bidirectional diode Db and the bit line BL. The locations of the bidirectional diode Db and the variable resistor Rc may be interchanged. The bidirectional diode Db may prevent a leakage current from flowing through the memory cell MCc when the memory cell MCc is non-selected.

Figure 8D:
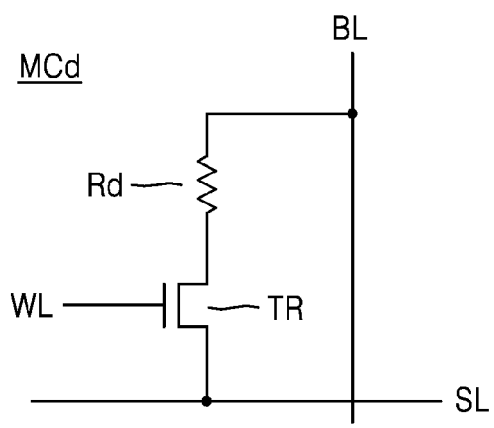

Referring to FIG. 8D, a memory cell MCd may include a variable resistor Rd and a transistor TR connected in series. The transistor TR may be a selection element, that is, a switching element that supplies or blocks a current to the variable resistor Rd in response to a voltage level applied to the word line WL. The transistor TR may be coupled between the variable resistor Rd and the word line WL, and the variable resistor Rd may be coupled between the transistor TR and the bit line BL. The locations of the transistor TR and the variable resistor Rd may be interchanged. The memory cell MCd may be selected or non-selected based on whether the transistor TR is turned on or turned off.

Figure 9:
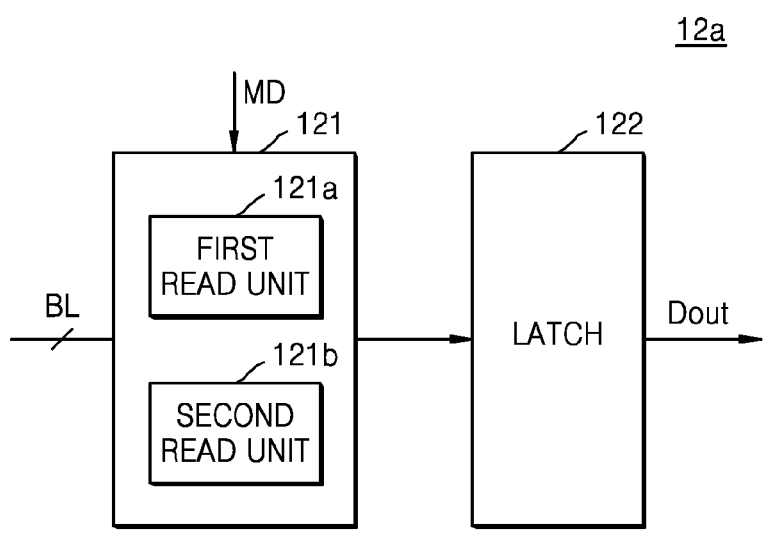
FIG. 9 is a block diagram of an example of a read circuit included in the memory device of FIG. 2.

Referring to FIG. 9, block diagram illustrating the read circuit 12a included in the memory device 10a of FIG. 2 in more detail, the read circuit 12a may include a read unit 121 and a latch 122, and the read unit 121 may include a first read unit 121a and a second read unit 121b.

The read unit 121 may determine whether a resistance level of a memory cell MC is less than or equal to a threshold resistance level, and may provide the result of this determination to the latch 122. This operation may be referred to as a first sensing or read operation. The first sensing or read operation may be performed by the first read unit 121a or the second read unit 121b. The latch 122 may latch the determination result received from the read unit 121 and may provide a latched determination result, namely the determination result Dout, to the control logic unit 14a.

The read unit 121 may receive the mode decision signal MD from the control logic unit 14a, may read data from the memory cell MC by activating the first read unit 121a or the second read unit 121b based on the mode decision signal MD, and may provide the read-out data to the latch 122. This operation may be referred to as a second sensing or read operation. The latch 122 may latch the read-out data received from the read unit 121 and may provide latched data to the memory controller 20 of FIG. 1.

In more detail, the first read unit 121a or the second read unit 121b that has been activated may be connected to a bit line BL to read data from the memory cell MC and to provide the read-out data to the latch 122. For example, when the mode decision signal MD indicates the first read mode, the first read unit 121a may be activated and connected to the bit line BL to read data from the memory cell MC. On the other hand, when the mode decision signal MD indicates the second read mode, the second read unit 121b may be activated and connected to the bit line BL to read data from the memory cell MC.

Figure 10:
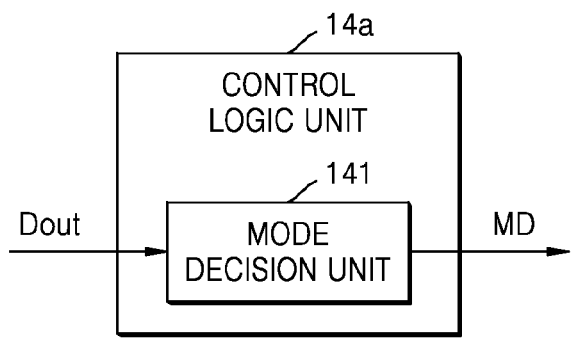
FIG. 10 is a block diagram of an example of a control logic unit included in the memory device of FIG. 2.

Referring to FIG. 10, a block diagram illustrating the control logic unit 14a included in the memory device 10a of FIG. 2 in more detail, the control logic unit 14a may include a mode decision unit 141. The mode decision unit 141 may receive the determination result Dout from the read circuit 12a and provide the mode decision signal MD based on the determination result Dout.

In more detail, when the determination result Dout represents that the resistance level of the memory cell MC is less than or equal to the threshold resistance level, the mode decision unit 141 may generate a mode decision signal MD indicating the first read mode that is based on the first factor inversely proportional to the resistance level. On the other hand, when the determination result Dout represents that the resistance level of the memory cell MC is greater than the threshold resistance level, the mode decision unit 141 may generate a mode decision signal MD indicating the second read mode that is based on the second factor proportional to the resistance level.

Figure 11:
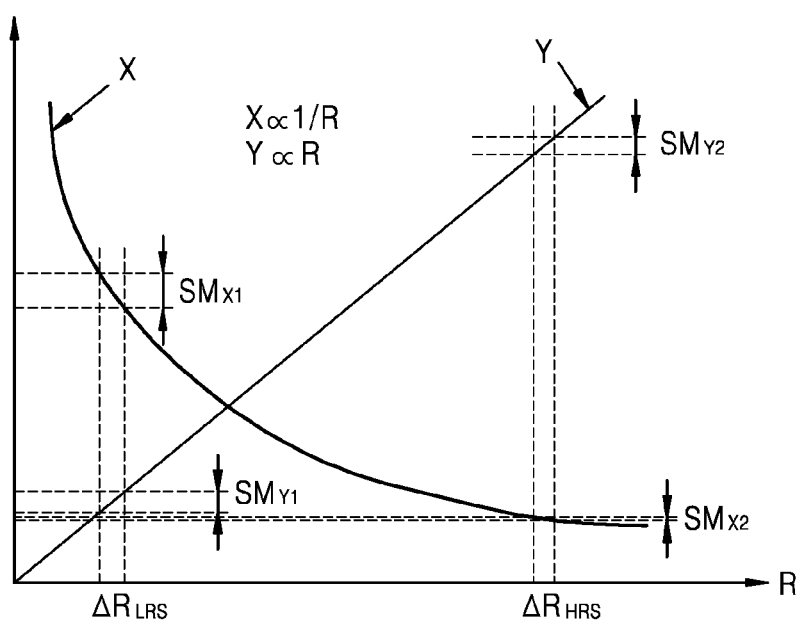
FIG. 11 is a graph showing a first factor and a second factor versus a resistance level of a memory cell.

Referring to FIG. 11, a graph showing a first factor X and a second factor Y versus a resistance level R of a memory cell, the horizontal axis indicates the resistance level R of the memory cell. The first factor X is inversely proportional to the resistance level R, and the second factor Y is proportional to the resistance level R. It will now be assumed that a first resistance difference $\Delta R_{LRS}$ in a low resistance state LRS, where the resistance level R is relatively low, is equal to a second resistance difference $\Delta R_{LRS}$ in a high resistance state HRS where the resistance level R is relatively high.

Regarding the first factor X, a difference (i.e., $SM_{X1}$) of the first factor X based on the first resistance difference $\Delta R_{LRS}$ is greater than a difference (i.e., $SM_{X2}$) of the first factor X based on the second resistance difference $\Delta R_{LRS}$. Accordingly, when data is read from a memory cell having the low resistance state LRS, the reading is performed using the first factor X, and thus sensing margin or sensing resolution is high, leading to improvement in the accuracy of reading. In an exemplary embodiment, the first factor X may be a cell current flowing in a memory cell.

Regarding the second factor Y, a difference (i.e., $SM_{Y1}$) of the second factor Y based on the first resistance difference $\Delta R_{LRS}$ is equal to a difference (i.e., $SM_{Y2}$) of the second factor Y based on the second resistance difference $\Delta R_{HRS}$. Based on an exemplary embodiment, the second factor Y may be a sensing voltage at a sensing time point of a sensing node connected to a memory cell. After the sensing node is precharged to a predetermined voltage, the sensing voltage may decrease with time based on connection between the sensing node and the memory cell. In this case, when the resistance level R of the memory cell is low, a large cell current flows in the memory cell, and thus the sensing voltage is reduced very quickly. Accordingly, when data is read from a memory cell having the low resistance state LRS by using the second factor Y, reading errors are highly likely to occur.

Accordingly, in this embodiment a read operation with respect to a memory cell having the low resistance state LRS may be performed in the first read mode based on the first factor X, and a read operation with respect to a memory cell having the high resistance state HRS may be performed in the second read mode based on the second factor Y. accordingly, different read modes may be applied based on different resistance levels R, thereby improving the accuracy of the reading.

Figure 12:
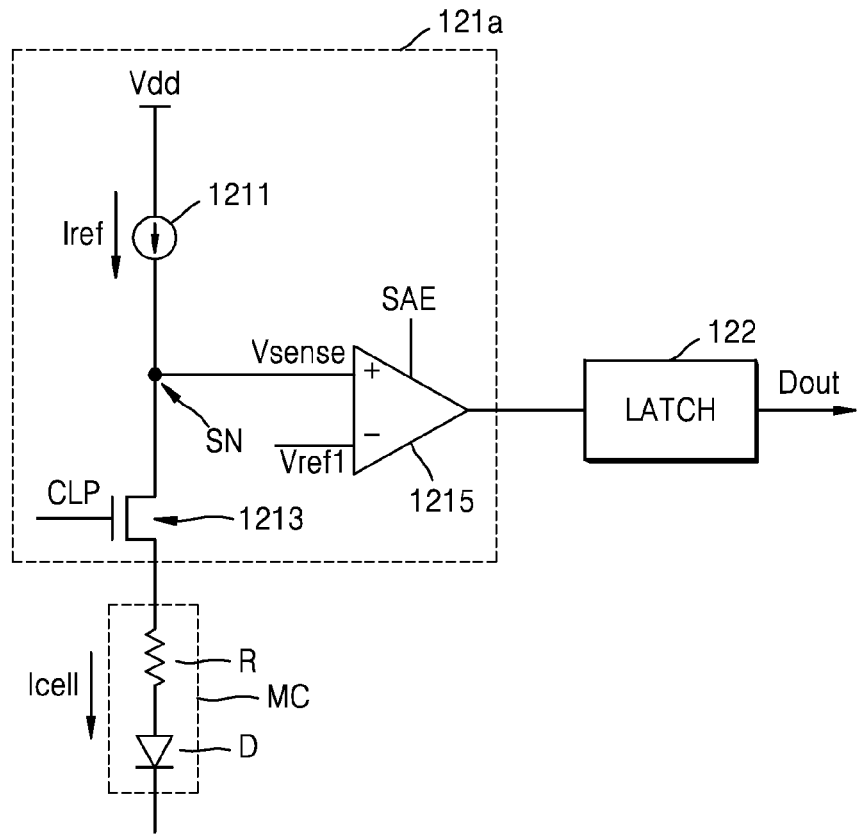
FIG. 12 is a circuit diagram illustrating a first read unit included in the read circuit of FIG. 9 in more detail.

Referring to FIG. 12, a circuit diagram illustrating the first read unit 121a of FIG. 9 in more detail, the first read unit 121a may read data from a memory cell MC based on the first factor X, which is inversely proportional to the resistance level of the memory cell MC, based on the mode decision signal MD indicating the first read mode. Based on the present embodiment, the first factor X may be a cell current Icell flowing in the memory cell MC, and the first read unit 121a may read data from the memory cell MC by comparing the cell current Icell to a reference current Iref.

In an exemplary embodiment the first read unit 121a may include a current generator 1211, a clamping unit 1213, and a sense amplifier 1215. However, the structure of the first read unit 121a is not limited thereto. For example, the first read unit 121a may have any structure as long as the first read unit 121a can read data from the memory cell MC by comparing the cell current Icell with the reference current Iref.

The components included in the first read unit 121a based on the present embodiment will now be described in more detail.

The current generator 1211 may be connected between a power supply terminal Vdd and a sensing node SN to generate the reference current Iref. For example, the current generator 1211 may include a current mirror circuit formed of two transistors. The reference current Iref may be previously determined based on the characteristics of the memory cell MC or the cell current Icell, and the two transistors included in the current mirror circuit may be selected based on the previously-determined reference current Iref.

The clamping unit 1213 may be connected between the sensing node SN and the memory cell MC to clamp a bit line voltage such that the bit line voltage remains within a range in which the bit line voltage can be suitably read. In more detail, the clamping unit 1213 may clamp the bit line voltage to a certain level based on a clamping control signal CLP. In other words, the bit line voltage may be determined based on the clamping control signal CLP. For example, the clamping unit 1213 may include an NMOS transistor 1213 having a gate via which the clamping control signal CLP is input, a drain connected to the sensing node SN, and a source connected to the memory cell MC.

The sense amplifier 1215 may compare a sensing voltage Vsense, which is a voltage of the sensing node SN, to a reference voltage Vref1, and may sense or read data stored in the memory cell MC based on the result of the comparison. The reference voltage Vref1 may have been previously determined based on the characteristics of the memory cell MC or the mode decision signal MD. The sense amplifier 1215 may perform a sensing operation based on a sense amplification enable signal SAE. In detail, when the sense amplification enable signal SAE is activated, the sense amplifier 1215 may perform a sensing operation.

In more detail, the sensing voltage Vsense may be applied to a non-inverting input terminal of the sense amplifier 1215, and the reference voltage Vref1 may be applied to an inverting input terminal of the sense amplifier 1215. Then, when the sensing voltage Vsense is greater than the reference voltage Vref1, the sense amplifier 1215 may output a logic level '1'. When the sensing voltage Vsense is less than the reference voltage Vref1, the sense amplifier 1215 may output a logic level '0'.

Figure 13:
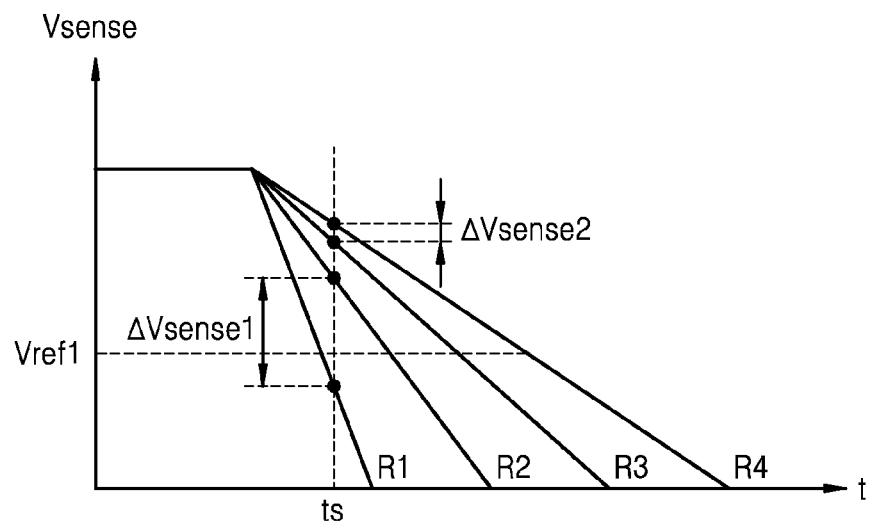
FIG. 13 is a graph showing a variation in a sensing voltage with time in a first read mode.

Referring to FIG. 13, a graph showing variation in the sensing voltage Vsense with time in the first read mode, the horizontal axis indicates the time t, and the vertical axis indicates the sensing voltage Vsense. Voltage levels of the memory cells having first through fourth resistance states RS1, RS2, ..., RS4 respectively correspond to first through fourth resistances R1, R2, ..., R4. Accordingly, voltage levels increase from the first resistance R1 to the fourth resistance R4.

A sensing voltage difference ΔVsense1 between the first resistance R1 and the second resistance R2 included in the low resistance state LRS at a sensing time point ts is greater than a sensing voltage difference ΔVsense2 between the third resistance R3 and the fourth resistance R4 included in the high resistance state HRS at the sensing time point ts. Accordingly, when a read operation is performed in the first read mode, a sensing margin in the case of the low resistance state LRS is greater than that in the case of the high resistance state HRS.

Figure 14:
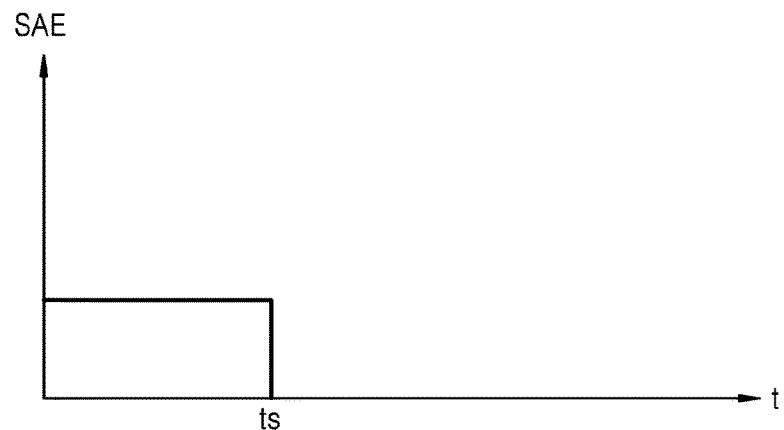
FIG. 14 is a graph showing a variation in a sense amplification enable signal of FIG. 12 with time.

Referring to FIG. 14, a graph showing a variation in the sense amplification enable signal SAE of FIG. 12 with time, the horizontal axis indicates the time t, and the vertical axis indicates the sense amplification enable signal SAE. The sense amplification enable signal SAE may be first activated to a logic level of '1' and then deactivated to a logic level of '0' at the sensing time point ts. Accordingly, an operation of the sense amplifier 1215 may be stopped at the sensing time point ts, and the latch 123 may latch an output of the sense amplifier 1215 that is provided at the sensing time point ts.

A read operation of the memory device 10a when the mode decision signal MD indicates the first read mode will now be described in detail with reference to FIGS. 12-14.

The clamping unit 1213 may clamp the bit line voltage VBL to a certain level. Accordingly, the cell current Icell flowing in the memory cell MC may be determined to be inversely proportional to the resistance level of the memory cell MC based on the bit line voltage VBL having that level. In this case, when the cell current Icell is greater than the reference current Iref, the sensing voltage Vsense decreases. When the cell current Icell is less than the reference current Iref, the sensing voltage Vsense increases. Thus, data may be read from the memory cell MC by comparing the sensing voltage Vsense, which varies based on the cell current Icell inversely proportional to the resistance level of the memory cell MC, with the reference voltage Vref1.

For example, when the resistance level of the memory cell MC is the first resistance R1, the cell current Icell flowing in the memory cell MC may be greater than the reference current Iref. Thus, the sensing voltage Vsense may decrease. Accordingly, the sensing voltage Vsense may be less than the reference voltage Vref1, and thus the sense amplifier 1215 may provide the output of logic level '0'. As such, it may be determined that the resistance level stored in the memory cell MC is the first resistance R1. On the other hand, when the resistance level of the memory cell MC is the second resistance R2, the cell current Icell flowing in the memory cell MC may be less than the reference current Iref. Thus, the sensing voltage Vsense may increase. Accordingly, the sensing voltage Vsense may be greater than the reference voltage Vref1, and thus the sense amplifier 1215 may provide the output of logic level '1'. As such, it may be determined that the resistance level stored in the memory cell MC is the second resistance R2.

As described above with reference to FIG. 11, the first factor X, namely, the cell current Icell, is inversely proportional to the resistance level R. Thus, when a first resistance difference ΔR1 in the low resistance state LRS is equal to a second resistance difference ΔR2 in the high resistance state HRS, a cell current difference ΔIcell1 in the low resistance state LRS is greater than a cell current difference ΔIcell1 in the high resistance state HRS. Accordingly, the sensing voltage difference ΔVsense1 between the first resistance R1 and the second resistance R2 included in the low resistance state LRS at the sensing time point ts is greater than the sensing voltage difference ΔVsense2 between the third resistance R3 and the fourth resistance R4 included in the high resistance state HRS at the sensing time point ts.

Accordingly, in the first read mode based on the first factor X, the sensing margin or sensing resolution in the low resistance state LRS may be greater than that in the high resistance state HRS. Therefore, based on the present embodiment, a read operation may be performed on a memory cell having the low resistance state LRS, in the first read mode, namely, the current sensing mode, that is based on the first factor X, for example, the cell current Icell.

Figure 15:
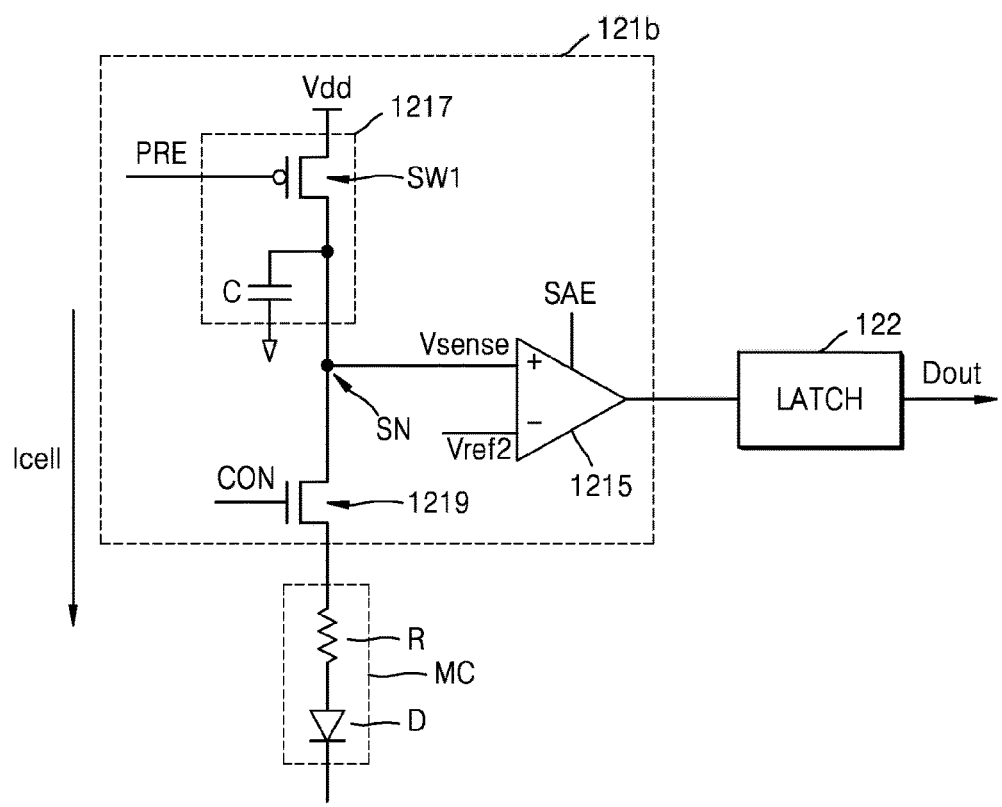
FIG. 15 is a circuit diagram illustrating a second read unit included in the read circuit of FIG. 9 in more detail.

Referring to FIG. 15, illustrating the second read unit 121b of FIG. 9 in more detail, the second read unit 121b may read data from the memory cell MC based on the second factor Y, which is proportional to the resistance level of the memory cell MC, based on the mode decision signal MD indicating the second read mode. Based on the present embodiment, the second factor Y may be the sensing voltage Vsense at the sensing time point ts, and the second read unit 121b may read data from the memory cell MC by comparing the sensing voltage Vsense at the sensing time point ts with the reference voltage Vref.

In an exemplary embodiment, the second read unit 121b may include a precharge unit 1217, a connection unit 1219, and a sense amplifier 1215, although the structure of the second read unit 121b is not limited thereto. For example, the second read unit 121b may have any structure as long as the second read unit 121b can read data from the memory cell MC by comparing the sensing voltage Vsense at the sensing time point ts with the reference voltage Vref. The components included in the second read unit 121b based on this exemplary embodiment will now be described in more detail.

The precharge unit 1217 may precharge the sensing voltage Vsense, the voltage level of the sensing node SN, to a predetermined voltage, for example a power supply voltage Vdd, during a precharge operation performed before a read operation or a sensing operation. Based on this exemplary embodiment, the precharge unit 1217 may include a switch SW1 between a power supply terminal Vdd and a sensing node SN, and a capacitor C connected to the sensing node SN.

The switch SW1 may be switched on or off based on a precharge enable signal PRE. For example, the switch SW1 may be implemented using a PMOS transistor including a gate via which the precharge enable signal PRE is applied, a source connected to the power supply terminal Vdd, and a drain connected to the sensing node SN. The capacitor C may be charged with the power supply voltage Vdd by operation of the switch SW1 which performs switching based on the precharge enable signal PRE. Accordingly, the sensing voltage Vsense may be precharged to the power supply voltage Vdd.

The connection unit 1219 may be switched on or off based on a connection control signal CON to perform connection or disconnection between a bit line, (e.g., the memory cell MC) and the sensing node SN. Accordingly, the bit line (memory cell MC) may be connected to the sensing node SN when the connection control signal CON is activated. Conversely, when the connection control signal CON is deactivated the bit line MC may be disconnected from the sensing node SN. For example, the connection unit 1219 may be an transistor having a gate via which the connection control signal CON is input, a drain connected to the sensing node SN, and a source connected to the memory cell MC.

The sense amplifier 1215 may compare a sensing voltage Vsense (e.g., voltage of the sensing node SN) with a reference voltage Vref2 and may sense or read data stored in the memory cell MC based on the result of the comparison. The reference voltage Vref2 may be previously determined based on the characteristics of the memory cell MC or the mode decision signal MD. The sense amplifier 1215 may perform a sensing operation based on a sense amplification enable signal SAE. For example, the sense amplifier 1215 may perform a sensing operation when the sense amplification enable signal SAE is activated. The sensing voltage Vsense may be applied to a non-inverting input terminal of the sense amplifier 1215, and the reference voltage Vref2 may be applied to an inverting input terminal of the sense amplifier 1215. When the sensing voltage Vsense is greater than the reference voltage Vref2, the sense amplifier 1215 may output a logic level '1'. When the sensing voltage Vsense is less than the reference voltage Vref2, the sense amplifier 1215 may output a logic level '0'.

Figure 16:
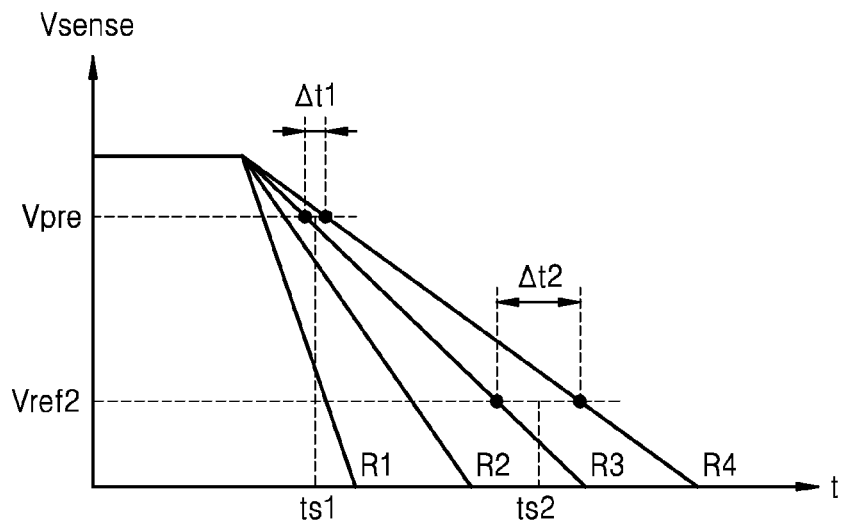
FIG. 16 is a graph showing a variation in a sensing voltage with time in a second read mode.

FIG. 16 is shows variation in the sensing voltage Vsense with time in the second read mode, the horizontal axis indicating time t, and the vertical axis indicating the sensing voltage Vsense. Voltage levels of memory cells having first through fourth resistance states RS1, RS2, . . . , RS4 respectively correspond to the respective first through fourth resistances R1, R2, . . . , R4. Accordingly, voltage levels increase in a direction from the first resistance R1 to the fourth resistance R4.

As can be seen, a first sensing margin Δt1 represents the difference between the respective times of the third and fourth resistances R3 and R4 at a predetermined voltage level Vpre of the sensing voltage Vsense, which occur around a first sensing time point ts1. Likewise, a sensing margin Δt2 represents the difference between the respective times of the third and fourth resistances R3 and R4 at a reference voltage level Vref2 of the sensing voltage Vsense, which occur around a second sensing time point ts2. It can be seen by the graph of FIG. 16 that the first sensing margin Δt1 is smaller than the second sensing margin Δt2.

Accordingly, to secure a sufficient sensing margin at a sensing time point ts, the sensing time point ts may be determined to be the time point at which a predetermined period of time has lapsed after the memory cell MC is connected to the sensing node SN by the connection unit 1219.

Figure 17:
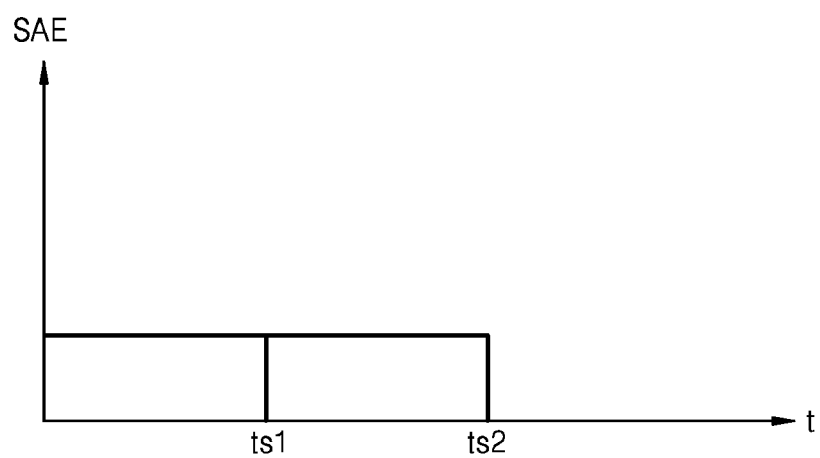
FIG. 17 is a graph showing a variation in a sense amplification enable signal of FIG. 15 with time.

FIG. 17 is a graph showing variation in the sense amplification enable signal SAE of FIG. 15 with time, the horizontal axis indicating the time t, and the vertical axis indicating the sense amplification enable signal SAE. The sense amplification enable signal SAE may be first activated to a logic level of '1' and then deactivated to a logic level of '0' at the first sensing time point ts1 and the second sensing time ts2. Accordingly, operation of the sense amplifier 1215 may be stopped at the first and second sensing time points ts1 and ts2, and the latch 123 may latch outputs of the sense amplifier 1215 that are provided at the first and second sensing time points ts1 and ts2, respectively.

Referring to FIGS. 15-17 to describe in more detail a read operation of the memory device 10*a* when the mode decision signal MD indicates the second read mode, the precharge unit 1217 may precharge the sensing voltage Vsense to a predetermined voltage level Vpre during a precharge period before a sensing period, and thus the sensing voltage Vsense may be charged at the predetermined voltage level Vpre before the precharge unit 1217 is connected to the bit line (memory cell MC). When the connection unit 1219 is switched on based on the connection control signal CON, the sensing node SN is connected to the bit line (memory cell MC), and thus the cell current Icell flows in the memory cell MC based on the predetermined voltage level Vpre of the sensing voltage Vsense and the voltage level of the memory cell MC.

Accordingly, the sensing voltage Vsense may decrease with time, and the amount of time for the sensing voltage Vsense to decrease may be determined to be proportional to the voltage level of the memory cell MC. In this case, when the resistance level R of the memory cell MC is low, the cell current Icell is high, and thus the amount of time for the sensing voltage Vsense to decrease is reduced. On the other hand, when the resistance level R of the memory cell MC is high, the cell current Icell is low, and thus the amount of time for the sensing voltage Vsense to decrease increases. Thus, the sensing time point ts may be determined by adjusting the sense amplification enable signal SAE, and data may be read from the memory cell MC by comparing the sensing voltage Vsense at the sensing time point ts with the reference voltage Vref2.

For example, when the resistance level of the memory cell MC is the third resistance R3, the cell current Icell flowing in the memory cell MC may be relatively high, and the sensing voltage Vsense the sensing time point ts may be smaller than the reference voltage Vref2. Thus, the sense amplifier 1215 may output a logic level '0'. As such, it may be determined that the resistance level stored in the memory cell MC is the third resistance R3.

For example, when the resistance level of the memory cell MC is the fourth resistance R4, the cell current Icell flowing in the memory cell MC may be relatively low, and the sensing voltage Vsense the sensing time point ts may be greater than the reference voltage Vref2. Thus, the sense amplifier 1215 may output a logic level '1'. As such, it may be determined that the resistance level stored in the memory cell MC is the fourth resistance R4.

As described above with reference to FIG. 11, the second factor Y, namely, the sensing voltage Vsense at the sensing time point ts, is proportional to the resistance level R. Thus, when the first resistance difference ΔR1 in the low resistance state LRS is equal to the second resistance difference ΔR2 in the high resistance state HRS, the sensing voltage difference ΔVsense1 in the low resistance state LRS is substantially equal to the sensing voltage difference ΔVsense2 in the high resistance state HRS.

However, in the low resistance state LRS, since the cell current Icell is high, the sensing voltage Vsense decreases quickly. Accordingly, when the second read mode based on the second factor Y is applied to a memory cell having the low resistance state LRS, the second read mode is very vulnerable to jitter or skew of a signal for deciding the sensing time point ts, namely, the sense amplification enable signal SAE.

The sensing margin Δt1 between the third resistance R3 and the fourth resistance R4 at the first sensing time point ts1 is smaller than the sensing margin Δt2 between the third resistance R3 and the fourth resistance R4 at the second sensing time point ts2. Thus, to secure a sufficient sensing time margin, a sensing operation needs to be performed at the sensing time point ts after the lapse of a predetermined period of time.

As such, in the second read mode based on the second factor Y, influences of jitter or skew of the sense amplification enable signal SAE upon the high resistance state HRS may be reduced, and a sufficient sensing margin or sensing resolution may be secured at the sensing time point ts after the lapse of a predetermined period of time. Therefore, in an exemplary embodiment a read operation may be performed on a memory cell having the high resistance state HRS, in the second read mode, i.e., the voltage sensing mode, that is based on the second factor Y, for example the sensing voltage Vsense at the sensing time point ts.

Figure 18:
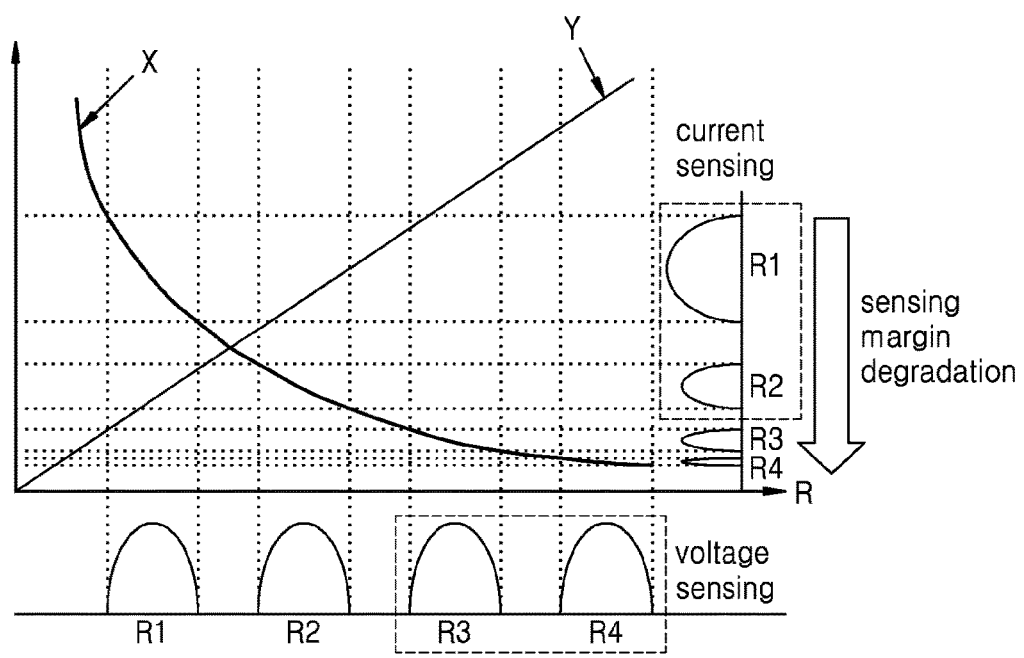
FIG. 18 is a graph showing a read operation of the memory device of FIG. 2.

FIG. 18 is a graph showing a read operation of the memory device 10a of FIG. 2. The horizontal axis indicates the resistance level R, the first factor X is inversely proportional to the resistance level R, and the second factor Y is proportional to the resistance level R. in this exemplary embodiment the first factor X may be the cell current Icell flowing in the memory cell MC, and the second factor Y may be the sensing voltage Vsense the sensing time point ts or the resistance level R.

In the case of the first factor X, a sufficient sensing margin may be secured for the first and second resistance levels R1 and R2 included in the low resistance state LRS where the resistance level R is low. Thus, current sensing may be performed on a memory cell MC having the low resistance state LRS in the first read mode based on the first factor X to thereby read data from the memory cell MC.

However, since a sensing margin decreases as resistance level R increases in the case of the first factor X, voltage sensing or resistance sensing may be performed with respect to the third and fourth resistance levels R3 and R4 included in the high resistance state HRS in the second read mode based on the second factor Y to thereby read data from a memory cell MC.

Accordingly, in this exemplary embodiment it is determined whether the resistance level of a memory cell MC is no more than a threshold resistance, a read operation with respect to a memory cell MC having the low resistance state LRS may be performed in the first read mode based on the first factor X, and a read operation with respect to a memory cell MC having the high resistance state HRS may be performed in the second read mode based on the second factor Y. Accordingly, by applying different read modes based on respectively different resistance states, a sufficient sensing margin or sensing resolution may be secured, leading to an improvement in the accuracy of reading.

Figure 19:
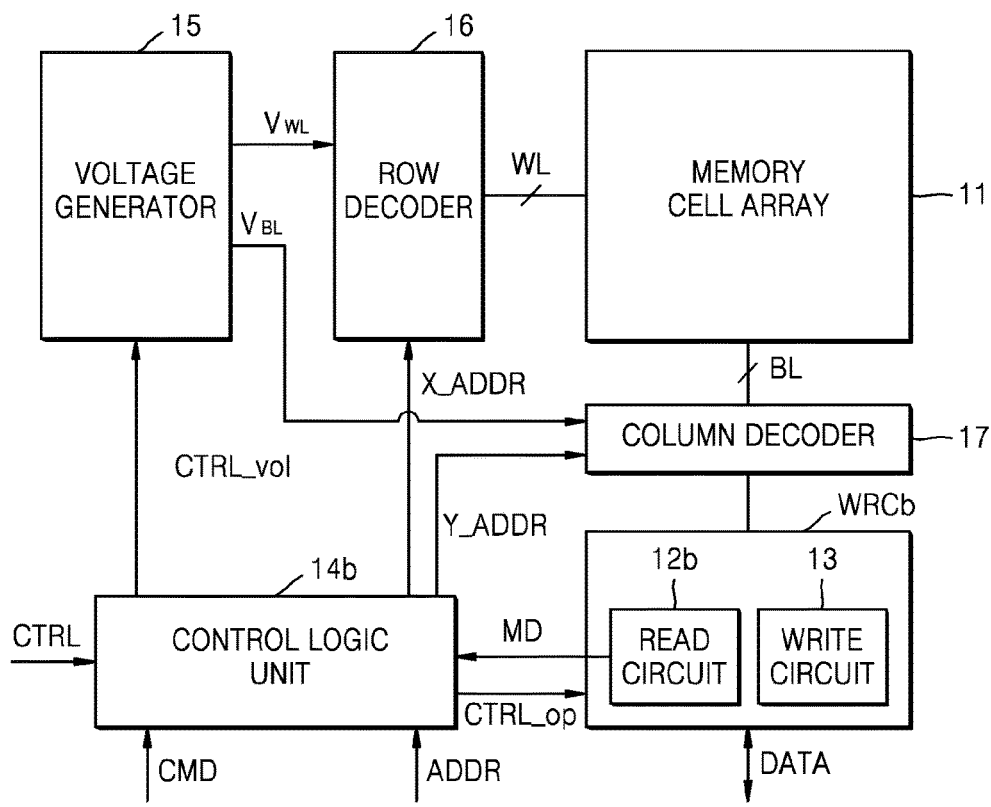
FIG. 19 is a block diagram of another example of a memory device included in the memory system of FIG. 1.

Referring to the block diagram of FIG. 19, the memory device 10b, which is another example of the memory device 10 included in the memory system 1 of FIG. 1, may include the memory cell array 11, a read circuit 12b, the write circuit 13, a control logic unit 14b, the voltage generator 15, the row decoder 16, and the column decoder 17. The read circuit 12b and the write circuit 13 may be combined with each other to constitute a write/read circuit WRCb. The memory device 10b based on the present embodiment is a modification of the memory device 10a of FIG. 2, and thus components other than the read circuit 12b and the control logic unit 14b may be implemented in substantially the same way as those included in the memory device 10a of FIG. 2. Accordingly, the components indicated by the same reference numerals or characters as those of FIG. 2 will not be described herein, and the memory device 10b will be described by focusing the read circuit 12b and the control logic unit 14b.

The read circuit 12b may be electrically connected to one of the bit lines BL to read data from a selected memory cell, so that the read circuit 12b may output the data DATA read from the memory cell array 11. In this exemplary embodiment, the read circuit 12b may determine whether a resistance level of a selected memory cell is equal to or greater than a threshold resistance level, generate a mode decision signal MD based on a determination result Dout, and provide the mode decision signal MD to the control logic unit 14b. The read circuit 12b may perform a read operation in a first or second read mode based on the mode decision signal MD.

In the first read mode, a read operation is performed based on a first factor inversely proportional to a resistance. In an exemplary embodiment, the first factor may be a cell current flowing in a memory cell, and accordingly the first read mode may be a current sensing mode. In the second read mode, a read operation is performed based on a second factor proportional to a resistance. In an exemplary embodiment, the second factor may be a sensing voltage at a sensing time point of a sensing node connected to a memory cell, and accordingly the second read mode may be a voltage sensing mode.

The control logic unit 14b may receive the command signal CMD, the address signal ADDR, and the control signal CTRL from the memory controller 20 to output various control signals for writing the data DATA to the memory cell array 11 or for reading the data DATA out of the memory cell array 11. In this way, the control logic unit 14b may control overall operations of the memory device 10b.

Various control signals outputted from the control logic unit 14b may be applied to the write/read circuit WRCb, the voltage generator 15, the row decoder 16, and the column decoder 17. In more detail, the control logic unit 14b may apply an operation control signal CTRL_op to the write/read circuit WRCb, and may apply a voltage control signal CTRL_vol to the voltage generator 15. The control logic unit 14b may also apply a row address signal X_ADDR to the row decoder 16 and may apply a column address signal Y_ADDR to the column decoder 17. The control logic unit 14b may receive the mode decision signal MD from the read circuit 12b and adjust the operation control signal CTRL_op based on the mode decision signal MD.

Figure 20:
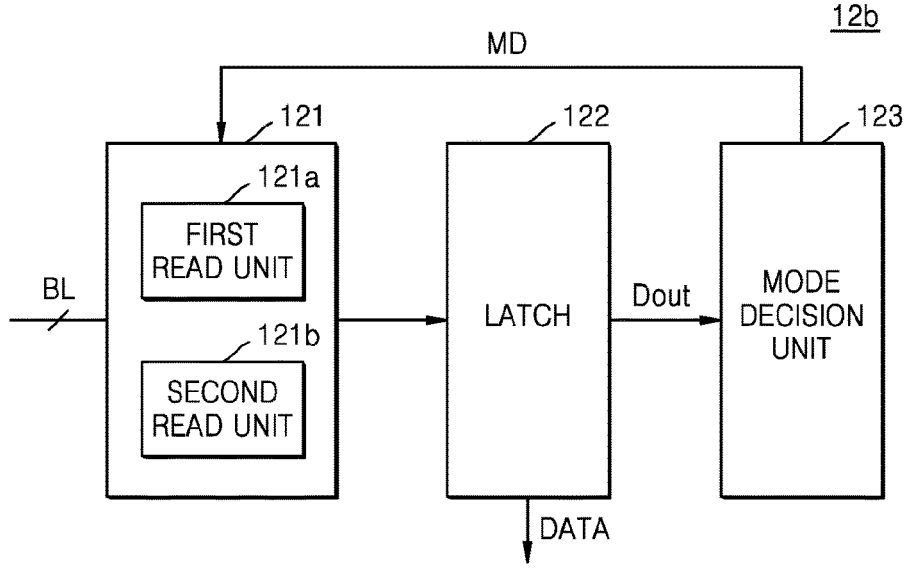
FIG. 20 is a block diagram of an example of a read circuit included in the memory device of FIG. 19.

Referring to the block diagram of FIG. 20, the read circuit 12b included in the memory device 10b of FIG. 19 may include a read unit 121, a latch 122, and a mode decision unit 123. The read unit 121 may include a first read unit 121a and a second read unit 121b. The read circuit 12b based on the present embodiment may further include the mode decision unit 123 compared with the read circuit 12a of FIG. 9, and the read unit 121 and the latch 122 may be substantially the same as those included in the read circuit 12a of FIG. 9. Accordingly, the read circuit 12b will now be described by focusing on the I shouldn't but in between you and your refrigerator. You know what's best for you. Mode decision unit 123.

The read unit 121 may determine whether a resistance level of a memory cell MC is less than or equal to a threshold resistance level, and may provide a result of the determination to the latch 122. This operation may be referred to as a first sensing or read operation. The first sensing or read operation may be performed by the first read unit 121a or the second read unit 121b. The latch 122 may latch the determination result received from the read unit 121 and may provide a latched determination result, namely, the determination result Dout, to the mode decision unit 123.

The mode decision unit 123 may receive the determination result Dout from the latch 122 and provide the mode decision signal MD based on the determination result Dout. For example when the determination result Dout represents that the resistance level of the memory cell MC is less than or equal to the threshold resistance level, the mode decision unit 123 may generate a mode decision signal MD indicating the first read mode that is based on the first factor inversely proportional to the resistance level. On the other hand, when the determination result Dout represents that the resistance level of the memory cell MC is greater than the threshold resistance level, the mode decision unit 123 may generate a mode decision signal MD indicating the second read mode that is based on the second factor proportional to the resistance level.

The read unit 121 may receive the mode decision signal MD from the mode decision unit 123, may read data from the memory cell MC by activating the first read unit 121a or the second read unit 121b based on the mode decision signal MD, and may provide the read-out data to the latch 122. This operation may be referred to as a second sensing or read operation. The latch 122 may latch the read-out data received from the read unit 121 and may provide latched data to the memory controller 20 of FIG. 1.

In more detail for example, the first read unit 121a or the second read unit 121b that has been activated may be connected to a bit line BL to read data from the memory cell MC and to provide the read-out data to the latch 122. For example, when the mode decision signal MD indicates a first read mode, the first read unit 121a may be activated and connected to the bit line BL to read data from the memory cell MC. On the other hand, when the mode decision signal MD indicates the second read mode, the second read unit 121b may be activated and connected to the bit line BL to read data from the memory cell MC.

The exemplary embodiment described with reference to FIGS. 19 and 20 may be considered a modification of the exemplary embodiment of FIG. 2, and thus the above description with reference to the embodiment of FIGS. 2-18 may be applied to this exemplary embodiment as well.

A method of reading the memory device based on exemplary embodiments will now be described with reference to FIGS. 1-21. A method of reading the memory device based on an exemplary embodiment comprises reading data from each of a plurality of memory cells included in a memory cell array included in the memory device. Thus, the description above with reference to FIGS. 1-20 may correspond to this exemplary method of reading the memory device.

Figure 21:
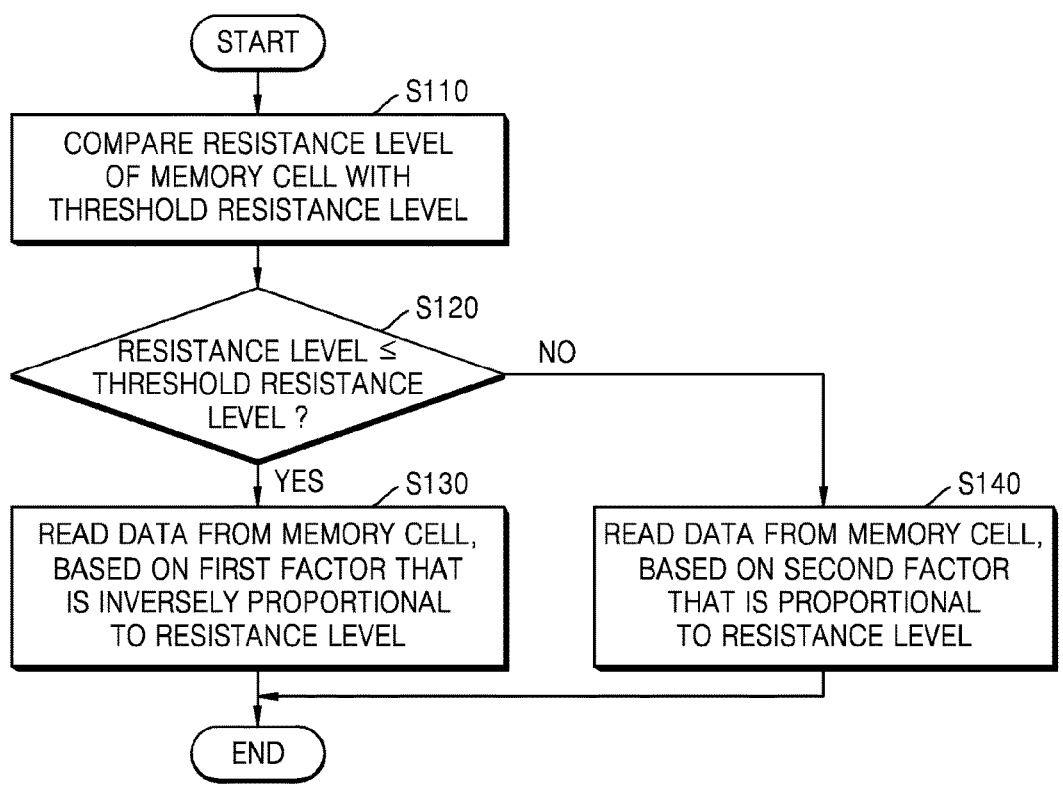
FIG. 21 is a flowchart of a method of reading a memory device, based on an embodiment of the inventive concept.

Referring to FIG. 21, a resistance level of a memory cell is compared (S110) with a threshold resistance level. For example, the read circuit 12a or 12b may compare the resistance level R of the memory cell MC with the threshold resistance level by sensing the memory cell MC.

In some possible embodiments, the read circuit 12a or 12b may compare the resistance level R of the memory cell MC with the threshold resistance level by sensing the memory cell MC based on the cell current Icell flowing in the memory cell MC, i.e., by using the current sensing mode. In other possible embodiments, the read circuit 12a or 12b may compare the resistance level R of the memory cell MC with the threshold resistance level by sensing the memory cell MC based on the sensing voltage Vsense at the sensing time point is of the sensing node SN connected to the memory cell MC, i.e., by using the voltage sensing mode.

It is determined (S120) whether the resistance level of the memory cell is no more than the threshold resistance level. For example, the read circuit 12a or 12b may determine whether the resistance level R of the memory cell MC is no more than the threshold resistance level data is read (S130) from the memory cell MC based on a first factor that is inversely proportional to resistance level (see FIG. 22). For example, the read circuit 12a or 12b may read data from the memory cell MC based on, for example, the cell current Icell flowing in the memory cell MC Otherwise, if it is determined that the resistance level of the memory cell is more than the threshold resistance level, data is read (S140) from the memory cell MC based on a second factor that is proportional to the resistance level (see FIG. 22). For example, the read circuit 12a or 12b may read data from the memory cell MC based on, for example, the sensing voltage Vsense at the sensing time point is of the sensing node SN connected to the memory cell MC.

In some exemplary embodiments, when the memory cell MC is an MLC, the threshold resistance level $R_{th}1$ may lie between the second resistance state RS2 and the third resistance state RS3. In other exemplary embodiments, when the memory cell MC is a TLC, the threshold resistance level $R_{th}2$ may lie in-between the second resistance state RS2 and the third resistance state RS3.

Figure 22:
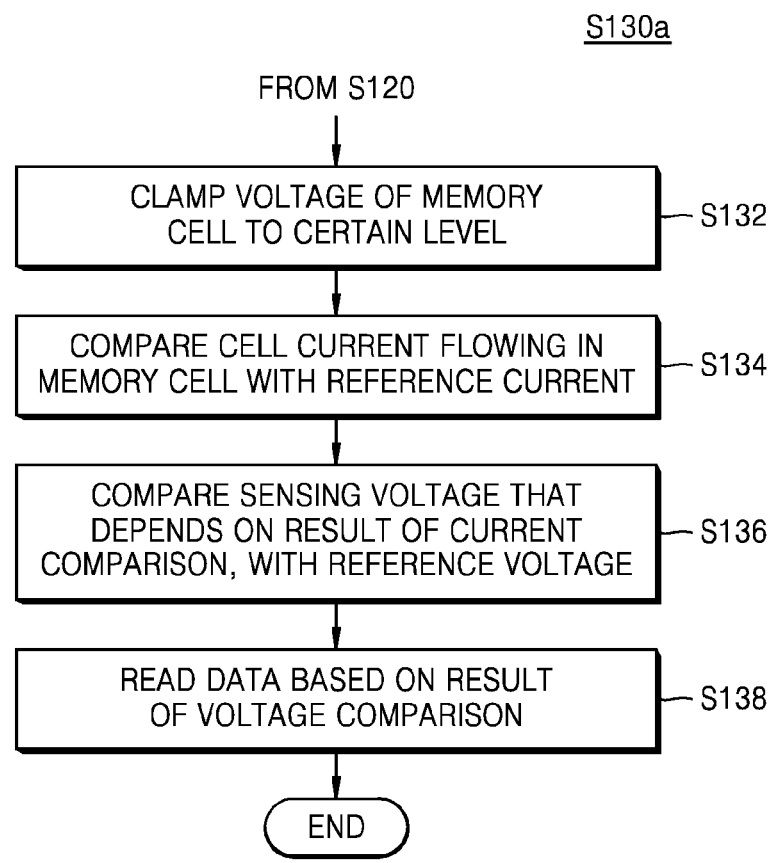
FIG. 22 is a flowchart of an example of the operation of reading data based on the first factor included in the method of FIG. 21.

Referring to FIG. 22, in an example of reading the data based on the first factor (S130 in FIG. 21), a clamping unit 1213 may clamp (S132) a voltage of the memory cell MC, i.e., the bit line voltage VBL, to a certain level. Accordingly, the cell current Icell, which is determined based on the resistance level R of the memory cell MC based on the bit line voltage VBL, may flow in the memory cell MC.

Cell current flowing in the memory cell may be compared (S134) with a reference current, e.g., current generator 1211 may generate the reference current Iref. When the cell current Icell is greater than the reference current Iref, the sensing voltage Vsense may decrease. When the cell current Icell is smaller than the reference current Iref, the sensing voltage Vsense may increase.

A sensing voltage that depends on a result of the current comparison may be compared (S136) with a reference voltage, e.g., the sense amplifier 1215 may compare the sensing voltage Vsense with the reference voltage Vref1.

Data may then be read (S138) based on the result of the voltage comparison. For example, when the sensing voltage Vsense is smaller than the reference voltage Vref1, the sense amplifier 1215 may output a logic level '0', for example, indicating that data stored in the memory cell MC is the first resistance R1. Conversely, when the sensing voltage Vsense is greater than the reference voltage Vref1, the sense amplifier 1215 may output a logic level '1', for example, indicating that the data stored in the memory cell MC is the second resistance R2.

Figure 23:
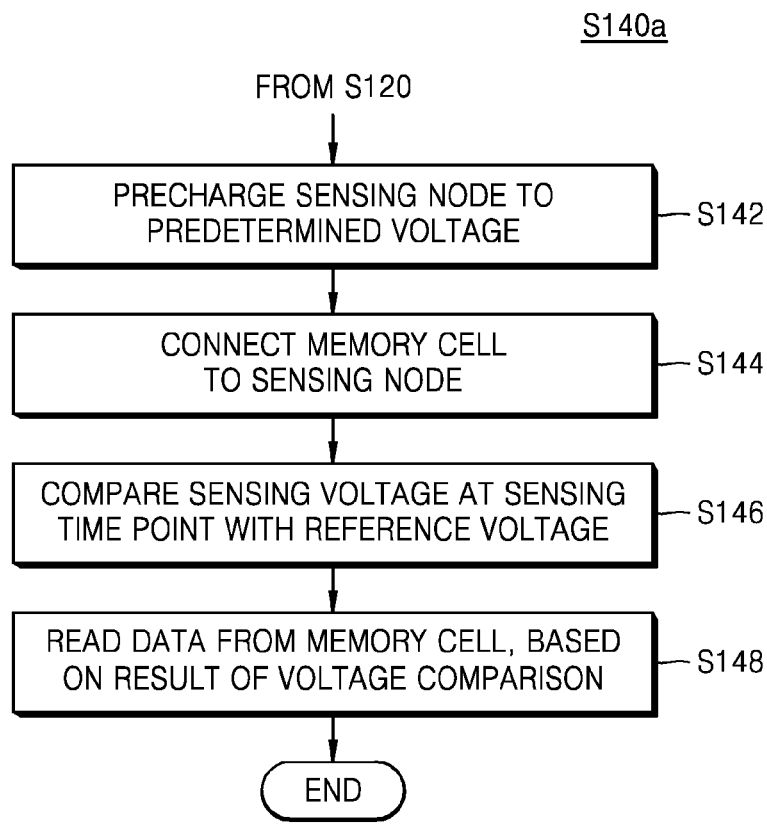
FIG. 23 is a flowchart of an example of the operation of reading data based on the second factor included in the method of FIG. 21.

Referring to FIG. 23, in an example of reading the data based on the second factor (S140 in FIG. 21), a sensing node connected to the memory cell is precharged (S142) to a predetermined voltage. The precharge unit 1217 may precharge the sensing voltage Vsense, which is the voltage level of the sensing node SN, to the predetermined voltage, for example, a power supply voltage Vdd, during a precharge operation performed before a sensing operation.

The memory cell is then connected (S144) to the sensing node. For example, the connection unit 1219 may be switched on or off based on a connection control signal CON and may connect the memory cell MC to the sensing node SN when the sensing operation starts.

A sensing voltage at a sensing time point is then compared (S146) with a reference voltage, e.g., the sense amplifier 1215 may compare the sensing voltage Vsense with the reference voltage Vref1.

Then data is read (S148) from the memory cell based on the result of the voltage comparison. When the sensing voltage Vsense is smaller than the reference voltage Vref2, the sense amplifier 1215 may output a logic level '0', for example, to indicate that data stored in the memory cell MC is the third resistance R3. Conversely, when the sensing voltage Vsense is greater than the reference voltage Vref2, the sense amplifier 1215 may output a logic level '1', for example, to indicate that the data stored in the memory cell MC is the fourth resistance R4.

Figure 24:
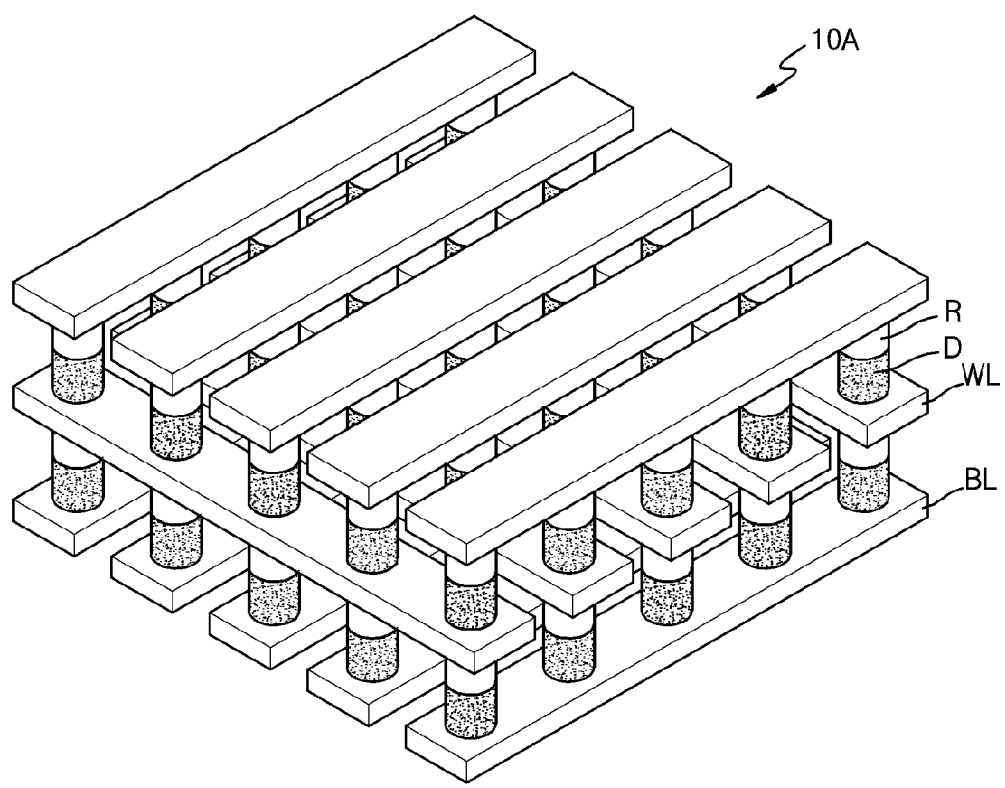
FIG. 24 is a perspective view of an example of the memory device of FIG. 1.

Referring to FIG. 24, a memory device 10A, which is an example of the memory device 10 of FIG. 1, may include a plurality of bit lines BL, a plurality of word lines WL, and a plurality of memory cells. The plurality of bit lines BL may be disposed to intersect the plurality of word lines WL. The plurality of memory cells may be disposed at respective intersections of the plurality of bit lines BL and the plurality of word lines WL, and each of the plurality of memory cells may include a diode D and a variable resistor R connected in series.

Figure 25:
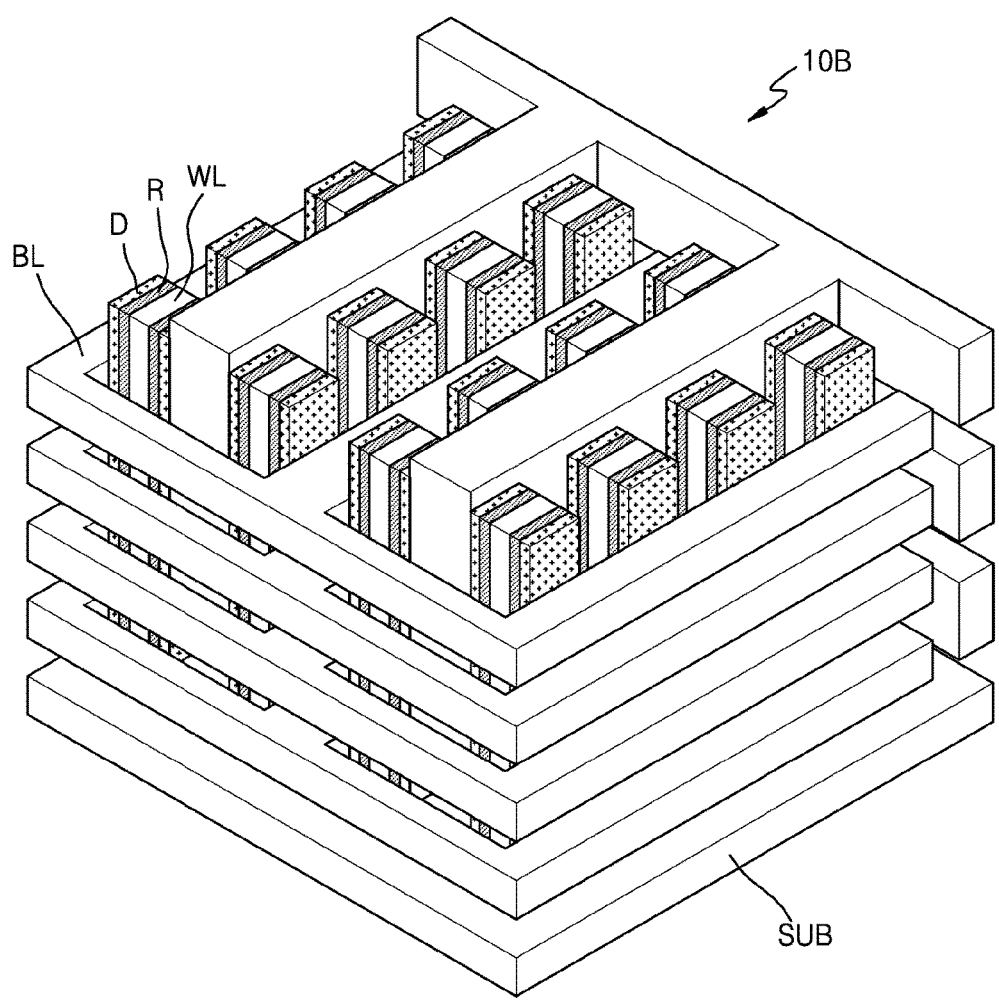
FIG. 25 is a perspective view of another example of the memory device of FIG. 1.

Referring to FIG. 25, a memory device 10B that is another example of the memory device 10 of FIG. 1 may include a plurality of bit lines BL disposed parallel with a substrate SUB, a plurality of word lines WL disposed perpendicular to the substrate SUB, and a plurality of memory cells disposed between the bit lines BL and the word lines WL. Each of the memory cells may include a diode material D and a variable resistive material R, which are disposed perpendicular to the substrate SUB. The variable resistive material R may be an amorphous silicon material doped with vanadium (V), cobalt (Co), nickel (Ni), palladium (Pd), iron (Fe) or manganese (Mn). Alternatively, the variable resistive material R may be a perovskite material such as $Pr_{1-x}Ca_xMnO_3$, $La_{1-x}Ca_xMnO_3$(LCMO), LaSrMnO$_3$(LSMO) or GdBaCo$_x$O$_y$(GBCO), for example.

Figure 26:
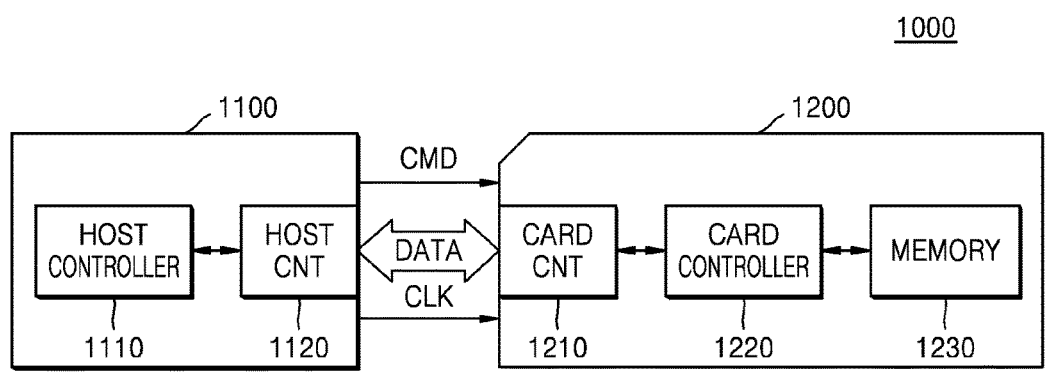
FIG. 26 is a block diagram of a memory card system including a memory system based on some embodiments of the inventive concept.

Referring to FIG. 26, a memory card system 1000 including a memory system based on some exemplary embodiments may include a host 1100 and a memory card 1200. The host 1100 may include host controllers 1110, 1120. The memory card 1200 may include court controllers 1210, 1220 and a memory device 1230. The memory card 1200 may be realized using the embodiments illustrated in FIGS. 1-25 for example.

The host 1100 may write data to, or read data from, the memory card 1200. The host controller 1110 may transmit a command signal CMD, a clock signal CLK generated from a clock generator (not shown) in the host 1100, and data DATA to the memory card 1200 through the host connector 1120.

The card controller 1220 may receive the command signal CMD through the card connector 1210 to store the data DATA in the memory device 1230 in synchronization with a clock signal generated from a clock generator (not shown) in the card controller 1220. That is, the memory device 1230 may store the data DATA outputted from the host 1100 therein.

The memory card 1200 may be a compact flash card (CFC), a Microdrive, a smart media card (SMC), a multimedia card (MMC), a security digital card (SDC), a memory stick (MC) or a universal serial bus (USB) for example.

Figure 27:
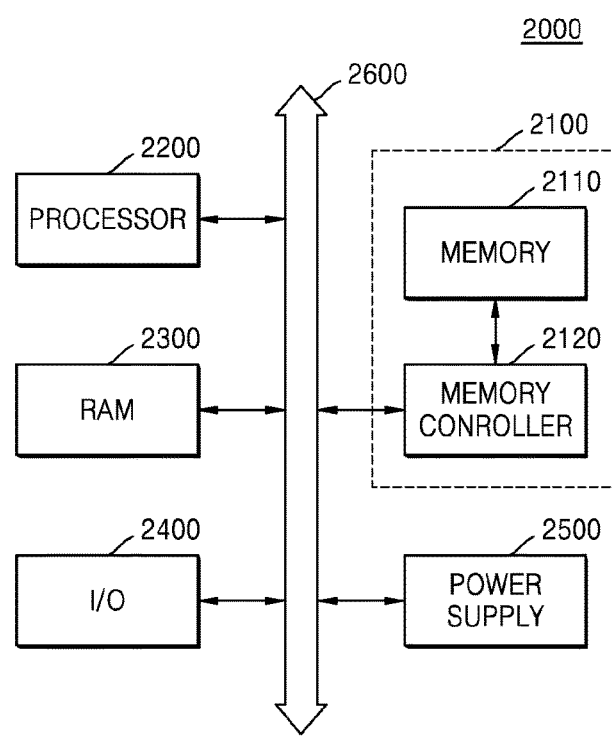
FIG. 27 is a block diagram of a computing system including a memory system based on embodiments of the inventive concept.

Referring to FIG. 27, a computing system 2000 including a memory system 2100 based on various embodiments may include the memory system 2100, a processor 2200, a random access memory (RAM) 2300, an input/output (I/O) device 2400, and a power supply device 2500. The computing system 2000 may further include ports (not shown) capable of communicating with a video card, a sound card, a memory card, a USB device or other electronic systems. The computing system 2000 may be a personal computer or a portable electronic system such as a notebook computer, a mobile phone, a personal digital assistant (PDA) or a digital camera.

The processor 2200 may execute specific calculations or perform specific tasks. In some embodiments, the processor 2200 may be a micro-processor or a central processing unit (CPU). The processor 2200 may communicate with the RAM 2300, the I/O device 2400 and the memory system 2100 through a bus 2600 such as an address bus, a control bus, or a data bus. The memory system 2100 may be realized using the embodiments illustrated in FIGS. 1-26 for example.

In some embodiments, the processor 2200 may be connected to an expansion bus such as a peripheral component interconnect (PCI) bus.

The RAM 2300 may store data necessary for operations of the computing system 2000 therein. For example, the RAM 2300 may be realized using a DRAM device, a mobile DRAM device, an SRAM device, a PRAM device, an FRAM device, an RRAM device and/or an MRAM device for example.

The I/O device 2400 may include an input device such as a keyboard, a keypad or a mouse and an output device such as a printer or a display for example. The power supply device 2500 may supply a power supply voltage necessary for operations of the computing system 2000.

Figure 28:
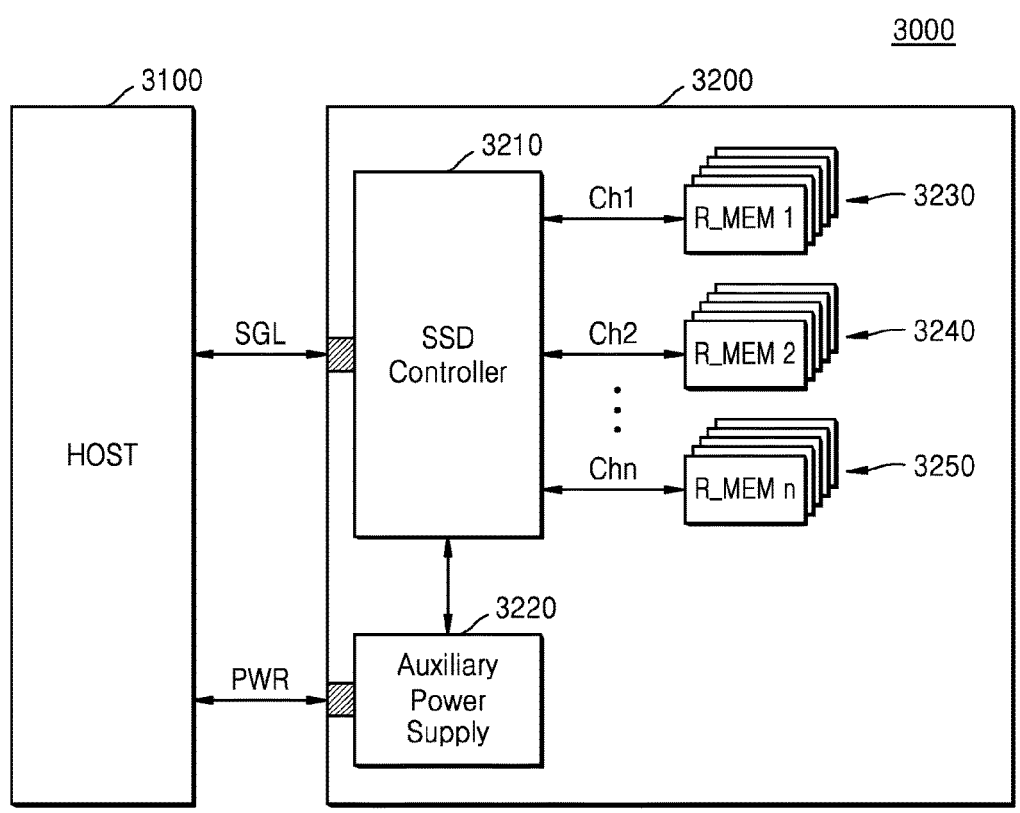
FIG. 28 is a block diagram of a solid state drive (SSD) system including a memory system based on some embodiments of the inventive concept.

Referring to FIG. 28, a solid state drive (SSD) system 3000 may include a memory system based on some exemplary embodiments. The SSD system 3000 may include a host 3100 and an SSD 3200. The SSD 3200 may transmit or receive signals SGL to or from the host 3100 through a signal connector and may receive a power supply voltage signal PWR outputted from the host 3100 through a power connector. The SSD system 3200 may include an SSD controller 3210, an auxiliary power supply device 3220, and a plurality of memory devices 3230, 3240, 3250. The SSD 3200 may be realized using the embodiments illustrated in FIGS. 1-27 for example.

While the inventive concept has been shown and described with reference to exemplary embodiments thereof, it will be understood that various changes in form and details may be made therein without departing from the spirit and scope of the following claims.

What is claimed is:

1. A method of reading a memory device including a memory cell that stores data of at least two bits, the method comprising:
   determining whether a cell resistance level of the memory cell is no greater than a threshold resistance level;
   if the cell resistance level is smaller than or equal to the threshold resistance level, then reading the data of the memory cell based on a first factor that is inversely proportional to the cell resistance level; and
   if the cell resistance level is greater than the threshold resistance level, then reading the data of the memory cell based on a second factor that is proportional to the cell resistance level,
   wherein the second factor corresponds to a sensing voltage at a sensing time point of a sensing node connected to the memory cell, and
   reading the data based on the second factor includes reading the data by comparing the sensing voltage at the sensing time point to a reference voltage,
   wherein a sense amplification enable signal instructing execution of a comparison between the sensing voltage and the reference voltage is deactivated at the sensing time point.

2. The method of claim 1, wherein:
   the first factor corresponds to cell current flowing in the memory cell; and
   reading the data based on the first factor includes comparing the cell current to a reference current.

3. The method of claim 2, wherein:
   the cell current is inversely proportional to the cell resistance level;
   a sensing voltage comprising a voltage level of a sensing node connected to the memory cell is determined based on a difference between the cell current and the reference current, and
   reading of the data based on the first factor includes:
      comparing the sensing voltage to a reference voltage; and
      reading the data based on a result of the comparison of the sensing voltage to the reference voltage.

4. The method of claim 3, wherein:
   when the cell current is greater than the reference current, the sensing voltage decreases, and
   when the cell current is smaller than the reference current, the sensing voltage increases.

5. The method of claim 1, wherein:
   the sensing voltage at the sensing time point decreases with time and is proportional to the cell resistance level, and
   reading of the data based on the second factor comprises:
      comparing the sensing voltage at the sensing time point to the reference voltage; and
      reading the data based on a result of the comparison of the sensing voltage at the sensing time point to the reference voltage.

6. The method of claim 1, further including:
   using a measurement of cell current flowing in the memory cell in the determination of whether the cell resistance level is no greater than the threshold resistance level;
   if the cell resistance level is determined to be smaller than or equal to the threshold resistance level, then generating a mode decision signal indicating a current sensing mode; and
   if the cell resistance level is determined to be greater than the threshold resistance level, then generating a mode decision signal indicating a voltage sensing mode.

7. The method of claim 1, further including:
   using a sensing voltage at a sensing time point of a sensing node connected to the memory cell in the determination of whether the cell resistance level is no greater than the threshold resistance level;
   if the cell resistance level is determined to be smaller than or equal to the threshold resistance level, then generating a mode decision signal indicating a current sensing mode; and
   if the cell resistance level is determined to be greater than the threshold resistance level, then generating a mode decision signal indicating a voltage sensing mode.

8. The method of claim 1, wherein:
   the memory cell is a multi-level cell (MLC) that can have a first, second, third, or fourth resistance state, and
   the threshold resistance level is greater than the second resistance state and smaller than the third resistance state.

9. The method of claim 1, wherein:
   the memory cell is a triple level cell (TLC) that can have a first, second, third, fourth, fifth, sixth, seventh, or eighth resistance state, and
   the threshold resistance level is greater than the fourth resistance state and smaller than the fifth resistance state.

10. A memory device comprising:
    a memory cell array including a memory cell that stores data of at least two bits and has a cell resistance level corresponding to the data; and
    a read circuit configured to read the data based on a first factor that is inversely proportional to the cell resistance level when the cell resistance level is smaller than or equal to a threshold resistance level, and to read the data based on a second factor that is proportional to the cell resistance level when the cell resistance level is greater than the threshold resistance level,
    wherein the second factor corresponds to a sensing voltage at a sensing time point of a sensing node connected to the memory cell, and
    wherein the read circuit comprises a sense amplifier that compares the sensing voltage at the sensing time point with a reference voltage, and
    a sense amplification enable signal instructing execution of an operation of the sense amplifier is deactivated at the sensing time point.

11. The memory device of claim 10, wherein:
    the first factor corresponds to cell current flowing in the memory cell.

12. The memory device of claim 10, wherein the read circuit includes at least one of:
    a precharge unit that precharges the sensing node to a predetermined voltage;
    a clamping unit that clamps voltage of a bit line connected to the memory cell to a certain level;
    a current generator that provides a reference current to the sensing node; and
    a connection unit that connects the read circuit to the bit line.

13. A memory control system comprising:
    a memory device including a memory cell array including a memory cell that stores data of at least two bits and has a cell resistance level corresponding to the data, and a read circuit configured to read the data based on a first factor that is inversely proportional to the cell resistance level when the cell resistance level is smaller than or equal to a threshold resistance level, and to read the data based on a second factor that is proportional to the cell resistance level when the cell resistance level is greater than the threshold resistance level; and a memory controller configured to control the memory device such that data stored in the memory device is read out and/or external data is stored in the memory device in response to a read and/or write request from a host, wherein the second factor corresponds to a sensing voltage at a sensing time point of a sensing node connected to the memory cell, and wherein the read circuit comprises a sense amplifier that compares the sensing voltage at the sensing time point with a reference voltage, and a sense amplification enable signal instructing execution of an operation of the sense amplifier is deactivated at the sensing time point.

14. The memory control system of claim 13, wherein:
the first factor corresponds to cell current flowing in the memory cell.

15. The memory control system of claim 14, wherein the read circuit further includes at least one of:
- a precharge unit that precharges the sensing node to a predetermined voltage;
- a clamping unit that clamps voltage of a bit line connected to the memory cell to a certain level;
- a current generator that provides a reference current to the sensing node; and
- a connection unit that connects the read circuit to the bit line.

16. The memory control system of claim 13, wherein the read circuit further includes at least one of:
- a precharge unit that precharges the sensing node to a predetermined voltage;
- a clamping unit that clamps voltage of a bit line connected to the memory cell to a certain level;
- a current generator that provides a reference current to the sensing node; and
- a connection unit that connects the read circuit to the bit line.

* * * * *